US012279496B2

(12) United States Patent
Cha et al.

(10) Patent No.: US 12,279,496 B2
(45) Date of Patent: *Apr. 15, 2025

(54) DISPLAY DEVICE WITH CONNECTION LINES AROUND TRANSMISSION AREA

(71) Applicant: SAMSUNG DISPLAY CO., LTD., Yongin-si (KR)

(72) Inventors: Hyunji Cha, Yongin-si (KR); Donghyeon Jang, Yongin-si (KR); Jihyun Ka, Yongin-si (KR); Wonkyu Kwak, Yongin-si (KR); Sukyoung Kim, Yongin-si (KR); Seungwoo Sung, Yongin-si (KR); Hwayoung Song, Yongin-si (KR); Youngsoo Yoon, Yongin-si (KR); Dongeup Lee, Yongin-si (KR); Wonse Lee, Yongin-si (KR); Yunkyeong In, Yongin-si (KR); Yujin Jeon, Yongin-si (KR); Jintae Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/333,521

(22) Filed: Jun. 12, 2023

(65) Prior Publication Data

US 2023/0320156 A1  Oct. 5, 2023

Related U.S. Application Data

(63) Continuation of application No. 16/919,787, filed on Jul. 2, 2020, now Pat. No. 11,678,532.

(30) Foreign Application Priority Data

Aug. 27, 2019  (KR) .................. 10-2019-0104984

(51) Int. Cl.
  *H10K 59/131*  (2023.01)
(52) U.S. Cl.
  CPC ................... *H10K 59/131* (2023.02)
(58) Field of Classification Search
  CPC .................................. H10K 59/131
  See application file for complete search history.

(56) References Cited

U.S. PATENT DOCUMENTS 7,830,591 B2  11/2010  Shimodaira
10,304,913 B2  5/2019  Choi et al.
(Continued)

FOREIGN PATENT DOCUMENTS

KR  10-2014-0053626 A  5/2014
KR  10-2016-0022438 A  3/2016
(Continued)

*Primary Examiner* — Lex H Malsawma
(74) *Attorney, Agent, or Firm* — Womble Bond Dickinson (US) LLP

(57) ABSTRACT

A display device includes: a substrate including a transmission area and a display area surrounding the transmission area; a plurality of display elements in the display area; a plurality of first horizontal lines and a plurality of second horizontal lines each extending in a first direction and spaced apart from each other with the transmission area therebetween; a plurality of first vertical lines and a plurality of second vertical lines each extending in a second direction intersecting with the first direction and spaced apart from each other with the transmission area therebetween; and a first connection line connecting at least one of the plurality of first vertical lines to at least one of the plurality of second vertical lines and detouring around the transmission area, wherein the first connection line is on a same layer as at least one of the plurality of first horizontal lines.

20 Claims, 20 Drawing Sheets

(56) References Cited

U.S. PATENT DOCUMENTS

| | | |
|---|---|---|
| 10,411,083 B2 | 9/2019 | Song et al. |
| 10,418,434 B2 | 9/2019 | Kim et al. |
| 11,678,532 B2 * | 6/2023 | Cha ..................... H10K 59/131 |
| | | 257/40 |
| 2014/0117320 A1 | 5/2014 | Jung |
| 2016/0056225 A1 | 2/2016 | Lee et al. |
| 2017/0162637 A1 | 6/2017 | Choi et al. |
| 2017/0288003 A1 | 10/2017 | Kim et al. |
| 2017/0294502 A1 | 10/2017 | Ka et al. |
| 2018/0308431 A1 | 10/2018 | Hekmatshoartabari et al. |
| 2019/0108793 A1 | 4/2019 | Kim et al. |
| 2019/0108802 A1 | 4/2019 | Imai |

FOREIGN PATENT DOCUMENTS

| | | |
|---|---|---|
| KR | 10-2017-0066767 A | 6/2017 |
| KR | 10-2017-0114026 A | 10/2017 |
| KR | 10-2017-0117291 A | 10/2017 |
| KR | 10-2019-0038718 A | 4/2019 |

\* cited by examiner

DISPLAY DEVICE WITH CONNECTION LINES AROUND TRANSMISSION AREA

CROSS-REFERENCE TO RELATED APPLICATIONS

This application is a continuation of U.S. patent application Ser. No. 16/919,787, filed Jul. 2, 2020, which claims priority to and the benefit of Korean Patent Application No. 10-2019-0104984, filed Aug. 27, 2019, the entire content of both of which is incorporated herein by reference.

BACKGROUND

Aspects of some example embodiments relate to a display device.

Recently, the uses of display devices have become more diversified. As display devices have become thinner and more lightweight, their range of uses has gradually expanded.

Additionally, as technology progresses, an area occupied by a display area of a display device may increase and functions that may be combined or associated with a display device may be added. In order to add various functions while increasing or maintaining a relatively large display area, some example embodiments may include a display device having an area for adding various functions instead of displaying an image inside a display area.

The above information disclosed in this Background section is only for enhancement of understanding of the background and therefore the information discussed in this Background section does not necessarily constitute prior art.

SUMMARY

Aspects of some example embodiments relate to a display device, and for example, to a display device in which a display panel includes a transmission area.

In order to increase functions that may be combined or associated with a display device, one or more example embodiments include a display panel including a transmission area in which a camera, a sensor, etc. may be arranged inside a display area, and a display device including the display panel.

Aspects of one or more example embodiments include a display panel and a display device that may have a relatively reduced area occupied by wirings detouring around a transmission area.

However, it should be understood that example embodiments described herein should be considered in a descriptive sense only and not for limitation of the disclosure.

Additional aspects will be set forth in part in the description which follows and, in part, will be apparent from the description, or may be learned by practice of the presented example embodiments of the disclosure.

According to some example embodiments, a display device includes a substrate including a transmission area and a display area surrounding the transmission area, a plurality of display elements arranged in the display area, a plurality of first horizontal lines and a plurality of second horizontal lines each extending in a first direction and spaced apart from each other with the transmission area therebetween, a plurality of first vertical lines and a plurality of second vertical lines each extending in a second direction intersecting with the first direction and spaced apart from each other with the transmission area therebetween, and a first connection line connecting at least one of the plurality of first vertical lines to at least one of the plurality of second vertical lines and detouring around the transmission area, wherein the first connection line is arranged on a first layer which is a same layer as a layer on which at least one of the plurality of first horizontal lines is arranged.

According to some example embodiments, the display device may further include a second connection line connecting at least one of the plurality of first vertical lines to at least one of the plurality of second vertical lines and detouring around the transmission area, wherein the second connection line may be arranged on a second layer different from the first layer.

According to some example embodiments, the first connection line and the second connection line may be respectively provided as a plurality of first connection lines and a plurality of second connection lines, and the plurality of first connection lines and the plurality of second connection lines may be alternately arranged around the transmission area.

According to some example embodiments, the first connection line may be connected to the at least one of the plurality of first vertical lines through a contact hole.

According to some example embodiments, the display device may further include a bridge metal connecting the first connection line to the at least one of the plurality of first vertical lines, wherein the bridge metal may be connected to the first connection line through a first contact hole, and the bridge metal may be connected to the at least one of the plurality of first vertical lines through a second contact hole.

According to some example embodiments, the display device may further include a third horizontal line extending from the display area in the first direction and detouring around the transmission area, wherein the third horizontal line may be arranged in a layer different from the first layer.

According to some example embodiments, the at least one of the plurality of first horizontal lines may be connected to at least one of the plurality of second horizontal lines through a horizontal connection line.

According to some example embodiments, the display device may further include an electrode layer surrounding the transmission area and overlapping the first connection line, a horizontal driving voltage line extending in the first direction, and a vertical driving voltage line extending in the second direction, wherein the horizontal driving voltage line and the vertical driving voltage line may be connected to the electrode layer.

According to some example embodiments, the display device may further include a second connection line connecting at least one of the plurality of first vertical lines to at least one of the plurality of second vertical lines and detouring around the transmission area, wherein the electrode layer at least partially overlaps the first connection line and the second connection line.

According to some example embodiments, the display device may further include a third connection line connecting the at least one of the plurality of first vertical lines to the at least one of the plurality of second vertical lines and detouring around the transmission area, wherein the third connection line may be arranged on a third layer that is the same layer as a layer on which the at least one of the plurality of first vertical lines is arranged.

According to some example embodiments, the display device may further include a fourth connection line connecting the at least one of the plurality of first vertical lines to the at least one of the plurality of second vertical lines and detouring around the transmission area, wherein the fourth connection line may be arranged on a fourth layer different from the third layer.

According to some example embodiments, the display device may further include a horizontal connection line extending in the first direction and detouring around the transmission area, wherein the horizontal connection line may connect the at least one of the plurality of first horizontal lines to at least one of the plurality of second horizontal lines.

According to some example embodiments, the display device may further include a second connection line connecting the at least one of the plurality of first vertical lines to the at least one of the plurality of second vertical lines and detouring around the transmission area, wherein the at least one of the plurality of first horizontal lines may be arranged on a second layer different from the first layer, and the second connection line may be arranged on the second layer.

According to some example embodiments, a display device includes a substrate including a transmission area, a display area surrounding the transmission area, and a non-display area between the transmission area and the display area, a plurality of display elements arranged in the display area, a plurality of first horizontal lines and a plurality of second horizontal lines each extending in a first direction and spaced apart from each other with the transmission area therebetween, a plurality of first vertical lines and a plurality of second vertical lines each extending in a second direction intersecting with the first direction and spaced apart from each other with the transmission area therebetween, and a plurality of connection lines arranged in the non-display area, connecting at least one of the plurality of first vertical lines to at least one of the plurality of second vertical lines, and including a first connection line, a second connection line, a third connection line, and a fourth connection line each arranged on different layers, wherein the first connection line is arranged on a layer that is the same layer as a layer on which at least one of the plurality of first horizontal lines is arranged.

According to some example embodiments, a thin film transistor may be arranged in the display area, the thin film transistor including a first semiconductor layer and a first gate electrode, and the first connection line may be arranged on the same layer as a layer on which the first gate electrode is arranged.

According to some example embodiments, a storage capacitor may be arranged in the display area, the storage capacitor including a first electrode and a second electrode, the first electrode being arranged on the same layer as a layer on which the first gate electrode is arranged, and the second electrode being arranged over the first electrode, and the second connection line may be arranged on the same layer as a layer on which the second electrode is arranged.

According to some example embodiments, the third connection line may be arranged on a third layer that is the same layer as a layer on which the at least one of the plurality of first vertical lines is arranged.

According to some example embodiments, the third connection line may have regions respectively overlapping a portion of the first connection line and a portion of the second connection line between the first connection line and the second connection line in a plan view.

According to some example embodiments, the fourth connection line may have regions respectively overlapping a portion of the first connection line and a portion of the second connection line between the first connection line and the second connection line in a plan view.

According to some example embodiments, the plurality of connection lines may further include a fifth connection line arranged on a layer different from layers on which the first connection line, the second connection line, the third connection line, and the fourth connection line are arranged.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
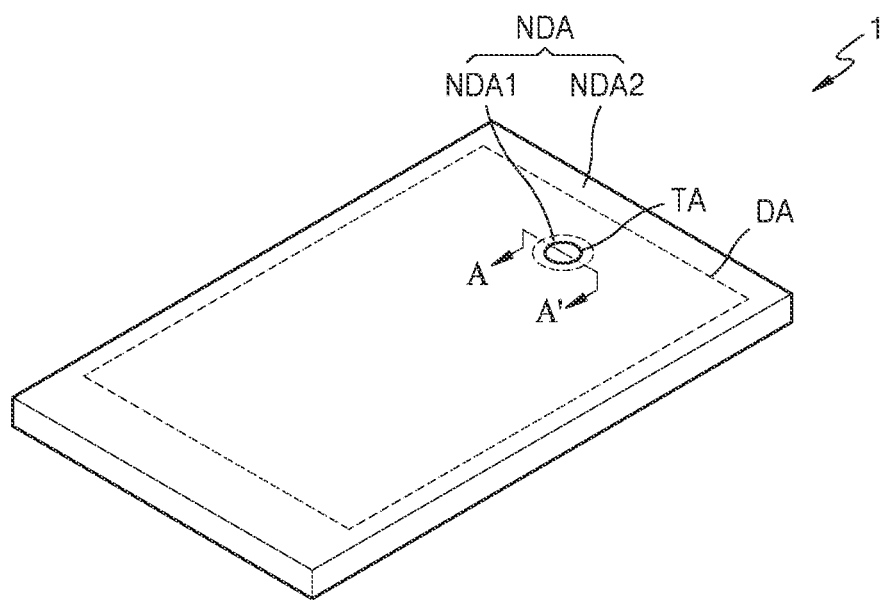
FIG. 1 is a perspective view of a display device according to some example embodiments.

Reference will now be made in more detail to some example embodiments, which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, example embodiments according to the present embodiments are described in more detail with reference to the accompanying drawings. In the drawings, the same reference numerals are given to the same or corresponding elements, and repeated description thereof is omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component and/or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component and/or may be "indirectly electrically connected" to other layer, region, or component with other layer, region, or component interposed therebetween.

FIG. 1 is a perspective view of a display device 1 according to some example embodiments.

Referring to FIG. 1, the display device 1 includes a display area DA that emits light and a non-display area NDA that does not emit light. The display device 1 may display an image by using light emitted from a plurality of pixels arranged in the display area DA.

The display device 1 includes a transmission area TA. The transmission area TA may be fully or partially surrounded by the display area DA. That is, according to some example embodiments, the transmission area TA may be entirely surrounded by and located within the display area DA. According to some embodiments, the transmission area TA may be only partially surrounded by the display area DA, such that the transmission area TA is bordered on a portion by the display area DA, and partially lies outside of the display area DA. The transmission area TA corresponds to an area that may transmit (or receive) light and/or sound that is output from an electronic element to the outside (e.g., an external electronic component) or progresses toward the electronic element from the outside. According to some example embodiments, in the case where light passes through the transmission area TA, a light transmittance may be 50% or more, 70% or more, 75% or more, 80% or more, 85% or more, or 90% or more.

A first non-display area NDA1 is provided between the transmission area TA and the display area DA. The first non-display area NDA1 may surround the transmission area TA. According to some example embodiments, pixels displaying an image are not arranged in the first non-display area NDA1, and wirings that transfer an electrical signal to the pixels may be arranged in the first non-display area NDA1, the pixels being spaced apart from each other with the transmission area TA therebetween.

A second non-display area NDA2 extends along an edge of the display device 1 and surrounds the display area DA. Pixels displaying an image are not arranged in the second non-display area NDA2, and various kinds of wirings, a built-in circuit unit, etc. may be arranged in the second non-display area NDA2.

Each pixel provided to the display device 1 may include a light-emitting diode as a display element that may emit light of a set or predetermined color. The light-emitting diode may include, as an emission layer, an organic light-emitting diode including an organic material. Alternatively, the light-emitting diode may include an inorganic light-emitting diode. Alternatively, the light-emitting diode may include quantum-dots as the emission layer. According to some example embodiments, the display device 1 may include a liquid crystal display device.

Hereinafter, for convenience of description, an example is described in which the display device 1 is an organic light-emitting display device including an organic light-emitting diode.

According to some example embodiments, as shown in FIG. 1, the transmission area TA may be arranged in a central portion of the display area DA in a width direction of the display device 1 and arranged in a top portion of the display area DA in a lengthwise direction of the display device 1. According to some example embodiments, the transmission area TA may be arranged in a central portion of the display area DA in the lengthwise direction of the display device 1 or arranged offset on a bottom portion of the display area DA. Alternatively, the transmission area TA may be arranged offset on the left or the right in the width direction of the display device 1.

The shape of the display area DA may include a circle, an ellipse, or a polygon such as a triangle or a pentagon. The size, the shape, the number, and the location of the transmission area TA may be variously changed.

FIGS. 2A to 2D are cross-sectional views of the display device 1 according to some example embodiments, taken along the line A-A' of FIG. 1.

Figure 2A:
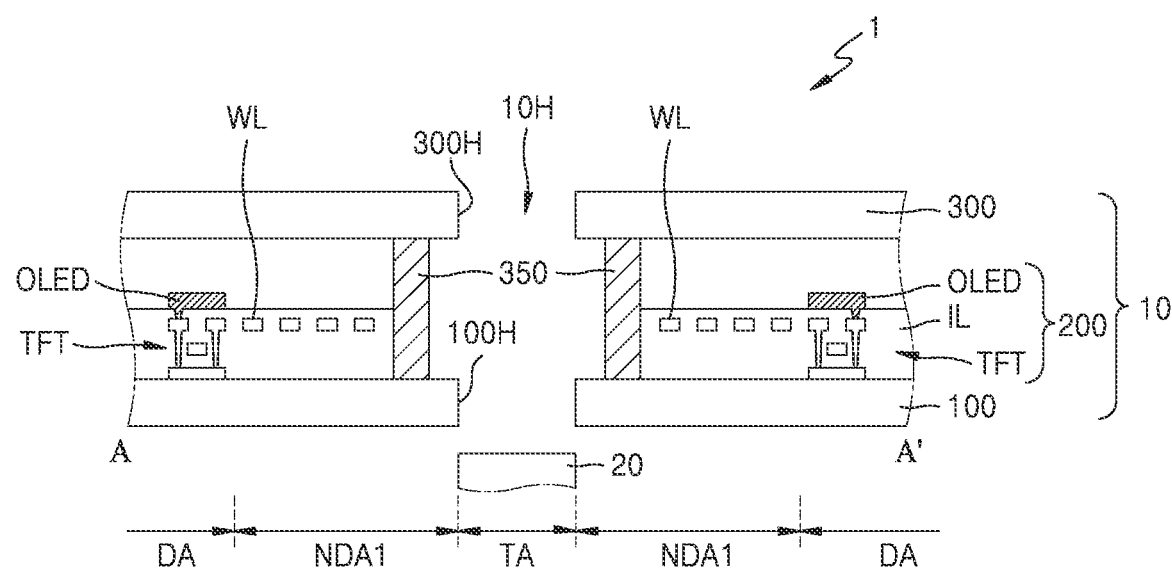
FIGS. 2A to 2D are cross-sectional views of a display device according to some example embodiments.

Referring to FIG. 2A, the display device 1 may include a display panel 10 and a component 20, the display panel 10 including display elements, and the component 20 corresponding to the transmission area TA.

The display panel 10 may include a substrate 100, an encapsulation substrate 300, and a display element layer 200 arranged therebetween, the encapsulation substrate 300 being an encapsulation member facing the substrate 100. A sealing material 350 (sealant) may be arranged between the substrate 100 and the encapsulation substrate 300, the sealing material 350 covering lateral sides of the display element layer 200. Though it is shown in FIG. 2A that the sealing material 350 is arranged on two opposite sides of the transmission area TA, it should be understood that the transmission area TA may be entirely surrounded by the sealing material 350 when viewed in a direction perpendicular to a main surface of the substrate 100.

The substrate 100 may include glass or a polymer resin. The polymer resin may include a polymer resin such as polyethersulfone (PES), polyacrylate, polyetherimide (PEI), polyethylene naphthalate (PEN), polyethylene terephthalate (PET), polyphenylene sulfide (PPS), polyarylate, polyarylate, polyimide (PI), polycarbonate (PC), and cellulose acetate propionate (CAP). The substrate 100 including the polymer resin may be flexible, rollable, or bendable. The substrate 100 may have a multi-layered structure including a layer including a polymer resin, and an inorganic layer. The encapsulation substrate 300 may include glass or polymer resin.

The display element layer 200 may include a circuit layer, an organic light-emitting diode OLED, and an insulating layer IL therebetween, the circuit layer including a thin film transistor TFT, and the organic light-emitting diode OLED being a display element connected to the thin film transistor TFT. The thin film transistor TFT and the organic light-emitting diode OLED connected thereto may be arranged in the display area DA, and some of wirings WL of the display element layer 200 may be located in the first non-display area NDA1. The wirings WL may provide a signal or voltage (e.g., a set or predetermined signal or voltage) to pixels spaced apart from each other with the transmission area TA therebetween. Though it is shown in FIG. 2A that the wirings WL do not overlap the sealing material 350 in the first non-display area NDA1, some of the sealing material 350 may be arranged over wirings WL according to some example embodiments.

The display panel 10 may include a through hole 10H corresponding to the transmission area TA. For example, the substrate 100 and the encapsulation substrate 300 may respectively include through holes 100H and 300H each corresponding to the transmission area TA. The display element layer 200 may also include a through hole corresponding to the transmission area TA.

According to some example embodiments, an input sensing member, a reflection prevention member, and a transparent window may be further arranged on the display panel 10, the input sensing member sensing a touch input, and the reflection prevention member including a polarizer and a retarder, or a color filter and a black matrix.

The component 20 may be located in the transmission area TA. The component 20 may include an electronic element that uses light or sound. For example, the component 20 may be a sensor such as an infrared sensor that emits and/or receives light, a camera that receives light and captures an image, a sensor that outputs and senses light or sound to measure a distance or recognize a fingerprint, a small lamp that outputs light, or a speaker that outputs sound. An electronic element that uses light may use light in various wavelength bands such as visible light, infrared light, and ultraviolet light. In the case where the display panel 10 includes the through hole 10H corresponding to the transmission area TA as in FIG. 2A, light or sound output from or received by the electronic element may be more effectively utilized.

Figure 2B:
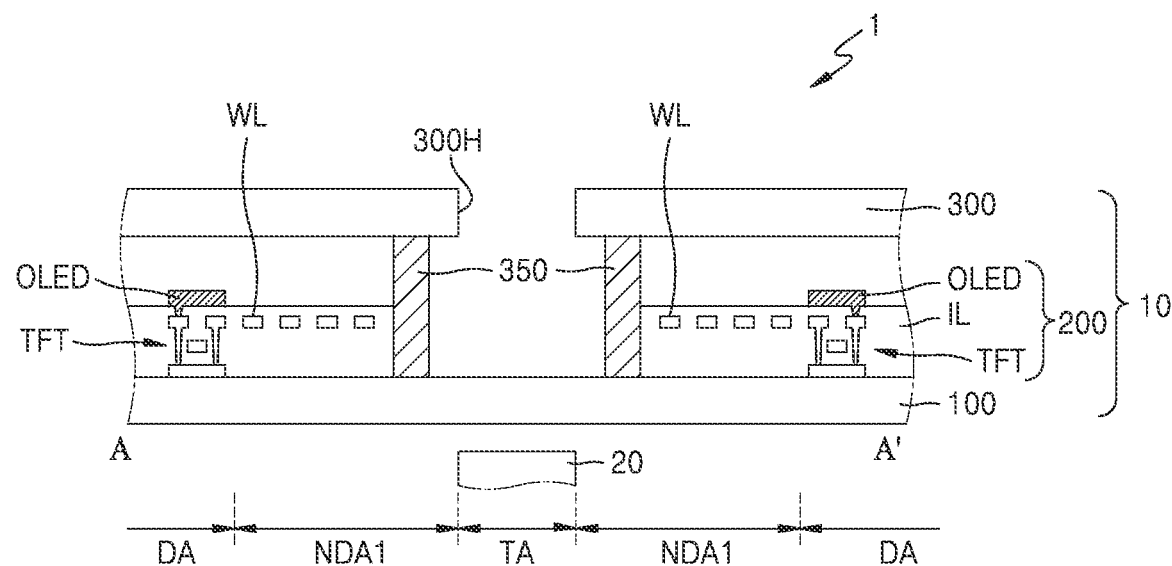
Figure 2C:
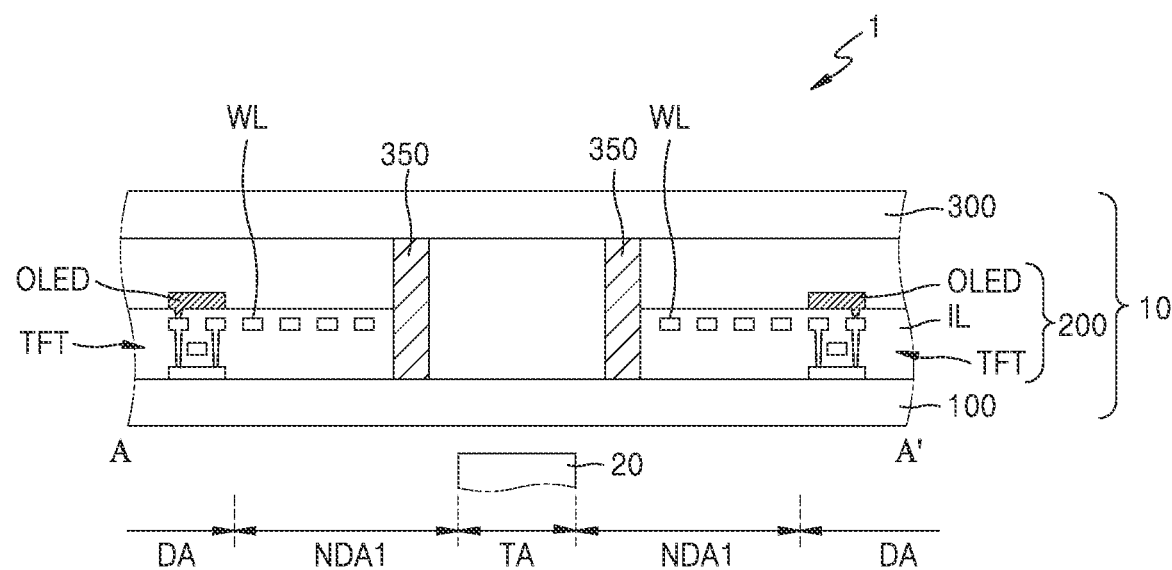
Figure 2D:
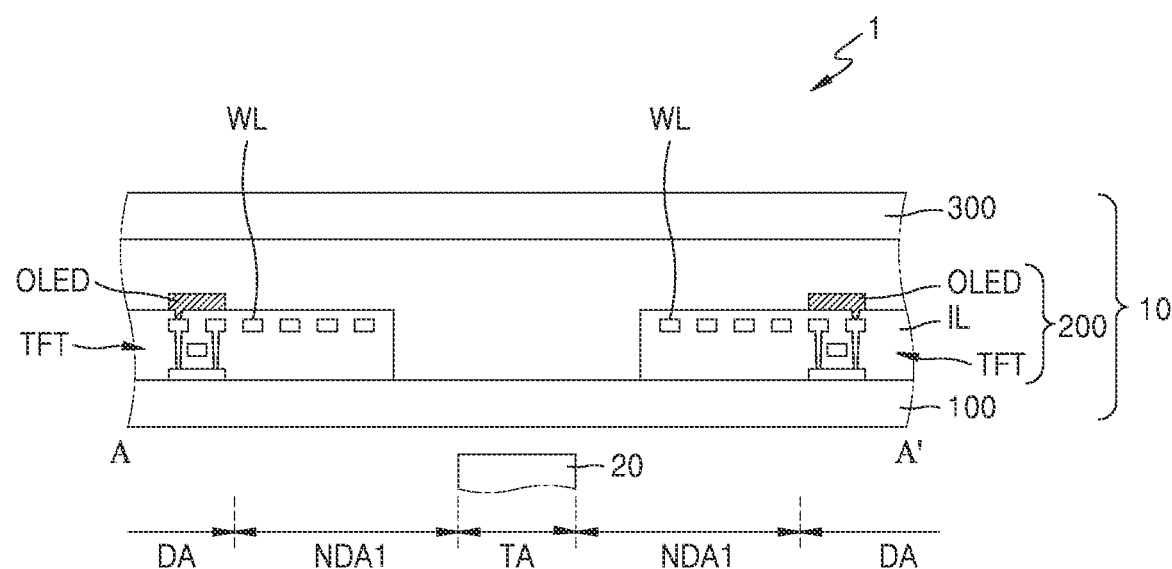

Unlike the display panel 10 including the through hole 10H corresponding to the transmission area TA in FIG. 2A, some elements of the display panel 10 may not include a through hole. For example, the encapsulation substrate 300 includes the through hole 300H corresponding to the transmission area TA as shown in FIG. 2B, but the substrate 100 may not include a through hole. Alternatively, as shown in FIGS. 2C and 2D, both the substrate 100 and the encapsulation substrate 300 may not have a through hole corresponding to the transmission area TA. Even though the substrate 100 does not include the through hole 100H as shown in FIGS. 2B to 2D, portions of the display element layer 200 that correspond to the transmission area TA may be removed and thus a light transmittance of the electronic element may be secured. Therefore, in the case where the display device 1 includes the display panel 10 shown in FIGS. 2B to 2D, it may be proper to use an electronic element that uses light as the electronic element.

As shown in FIG. 2D, the display panel 10 may not include the sealing material 350 around the transmission area TA. Because the display panel 10 of FIG. 2D does not include through holes in the substrate 100 and the encapsulation substrate 300 that correspond to the transmission area TA, external air may not penetrate to the transmission area TA.

The component 20 shown in FIGS. 2A to 2D may be located inside the through hole 10H so as to overlap lateral sides of the display panel 10 that define the through hole 10H.

The component 20 may be another element besides the electronic element. According to some example embodiments, in the case where the display device 1 is used as a smartwatch or an instrument panel for an automobile, the component 20 may be a member such as clock hands or a needle indicating set or predetermined information (e.g. the velocity of a vehicle, etc.). Alternatively, the component 20 may include an element such as an accessory that increases the aesthetic sense of the display panel 10.

Figure 3A:
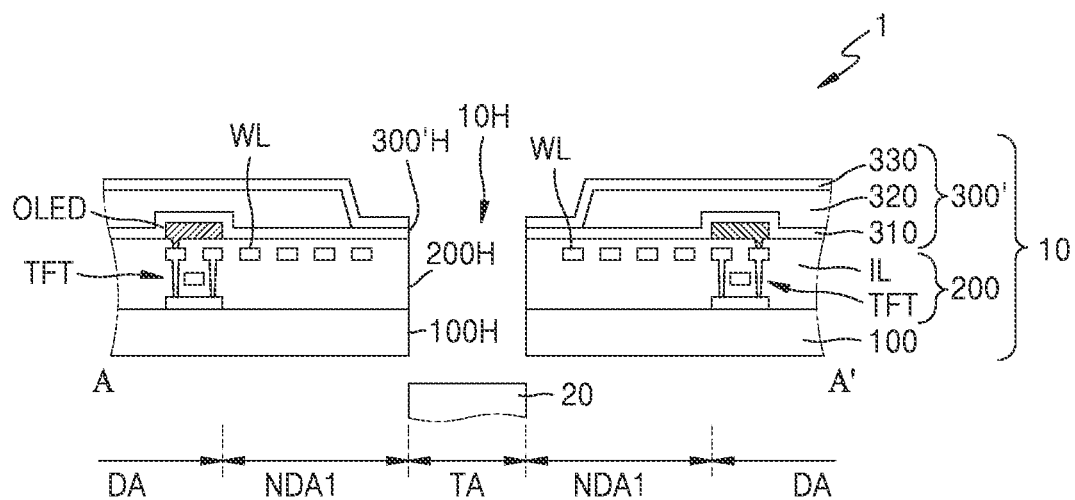
FIGS. 3A to 3C are cross-sectional views of a display device according to some example embodiments.
Figure 3B:
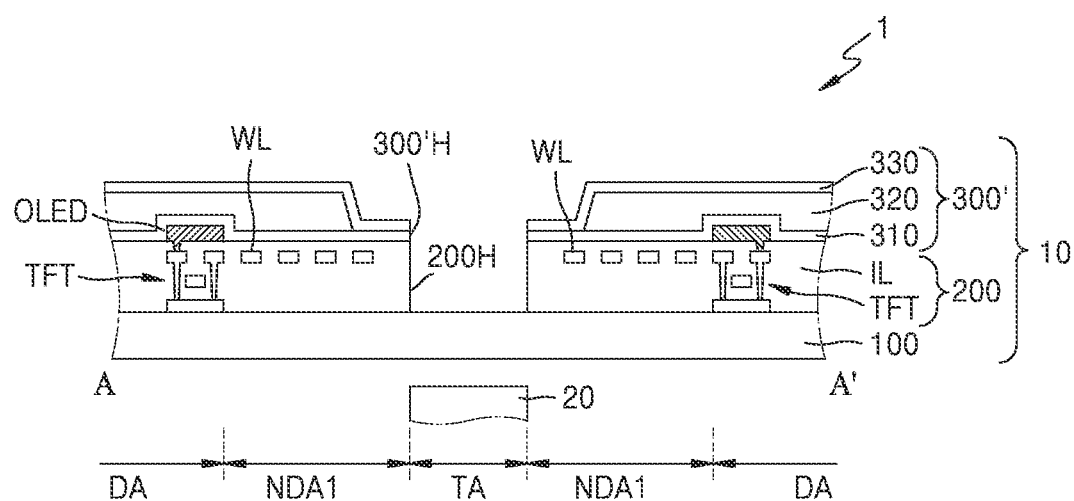
Figure 3C:
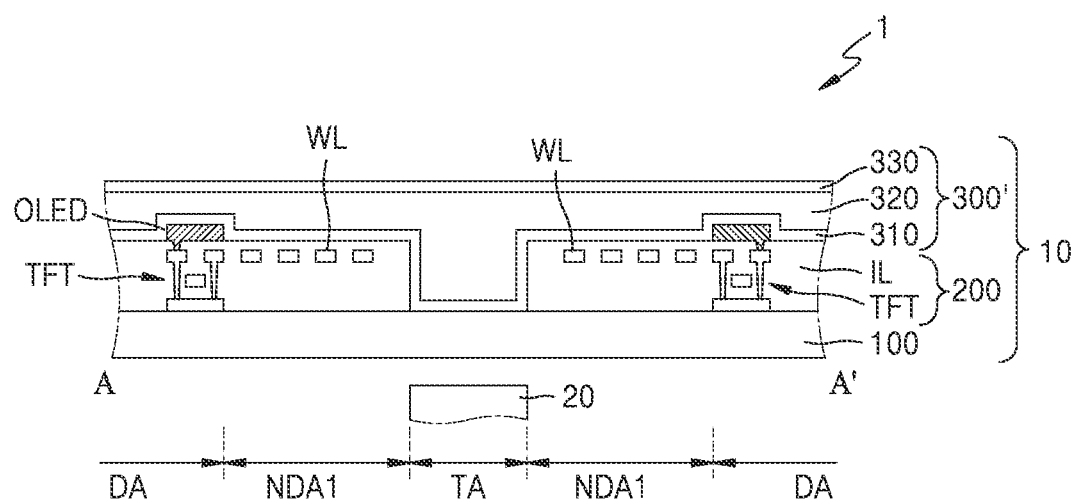

FIGS. 3A to 3C are cross-sectional views of the display device 1 according to some example embodiments taken along the line A-A' of FIG. 1.

Referring to FIG. 3A, like the display device 1 described with reference to FIG. 2A, the display device 1 may include the display panel 10 and the component 20. Also, according to some example embodiments, the display device 1 may further include an input sensing member sensing a touch input, a reflection prevention member, a window, etc. arranged on the display panel 10.

Unlike the display panel 10 including the encapsulation substrate 300 as an encapsulation member and the sealing material 350 described above with reference to FIG. 2A, the display panel 10 according to the present embodiment may include a thin-film encapsulation layer 300' as an encapsulation member. In this case, the flexibility of the display panel 10 may be improved even more. Hereinafter, for convenience of description, a difference is mainly described.

The thin-film encapsulation layer 300' may include at least one inorganic encapsulation layer and at least one organic encapsulation layer. With regard to this, FIG. 3A shows first and second inorganic encapsulation layers 310 and 330, and an organic encapsulation layer 320 therebetween.

The first and second inorganic encapsulation layers 310 and 330 may include at least one inorganic insulating material among silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The organic encapsulation layer 320 may include a polymer-based material. The polymer-based material may include an acryl-based resin, an epoxy-based resin, polyimide, and polyethylene.

The display panel 10 may include the through hole 10H corresponding to the transmission area TA. For example, the substrate 100 and the thin-film encapsulation layer 300' may respectively include through holes 100H and 300H' each corresponding to the transmission area TA. The first and second inorganic encapsulation layers 310 and 330, and the organic encapsulation layer 320 each may include holes corresponding to the transmission area TA. A size of the hole of the organic encapsulation layer 320 may be greater than sizes of the holes of the first and second inorganic encapsulation layers 310 and 330, and thus the first inorganic encapsulation layer 310 may contact the second inorganic encapsulation layer 330 around the transmission area TA.

Unlike the display panel 10 including the through hole 10H corresponding to the transmission area TA in FIG. 3A, the display panel 10 may not include a through hole. As shown in FIG. 3B, the thin-film encapsulation layer 300' includes the through hole 300H' corresponding to the transmission area TA, but the substrate 100 may not include a through hole. Alternatively, as shown in FIG. 3C, both the substrate 100 and the thin-film encapsulation layer 300' may not include through holes corresponding to the transmission area TA. Even though the substrate 100 does not include the through hole 100H as shown in FIGS. 3B and 3C, portions of the display element layer 200 that correspond to the transmission area TA may be removed and thus a light transmittance for the electronic element, which is the component 20, may be secured as described above.

In the case where the thin-film encapsulation layer 300' does not include the through hole as shown in FIG. 3C, the at least one inorganic encapsulation layer and the at least one organic encapsulation layer each may cover a portion of the substrate 100 in the transmission area TA. In this case, a portion of the display element layer 200 corresponding to the transmission area TA between the substrate 100 and the thin-film encapsulation layer 300' may be removed. Though it is shown in FIG. 3A that all of the insulating layer IL corresponding to the transmission area TA is removed, some layers of the insulating layer IL, which is a multi-layer, may be removed.

The component 20 may be located inside the through hole 10H, for example, may be inside the through hole 100H of the substrate 100 and a through hole 200H of the display element layer 200 as shown in FIG. 3A or may be located inside the through hole 200H of the display element layer 200 as shown in FIG. 3B so as to overlap the lateral sides of the display panel 10 that define the through hole 10H.

Though it is shown in FIGS. 2A to 2C that the display panel 10 includes only the encapsulation substrate 300 as an encapsulation member and it is shown in FIGS. 3A to 3C that the display panel 10 includes only the thin-film encapsulation layer 300' as an encapsulation member, the display panel 10 according to some example embodiments may employ both the encapsulation substrate 300 and the thin-film encapsulation layer 300'. For example, the display panel 10 may include both one of the encapsulation substrates 300 shown in FIGS. 2A to 2C and one of the thin-film encapsulation layers 300' shown in FIGS. 3A to 3C.

Figure 4:
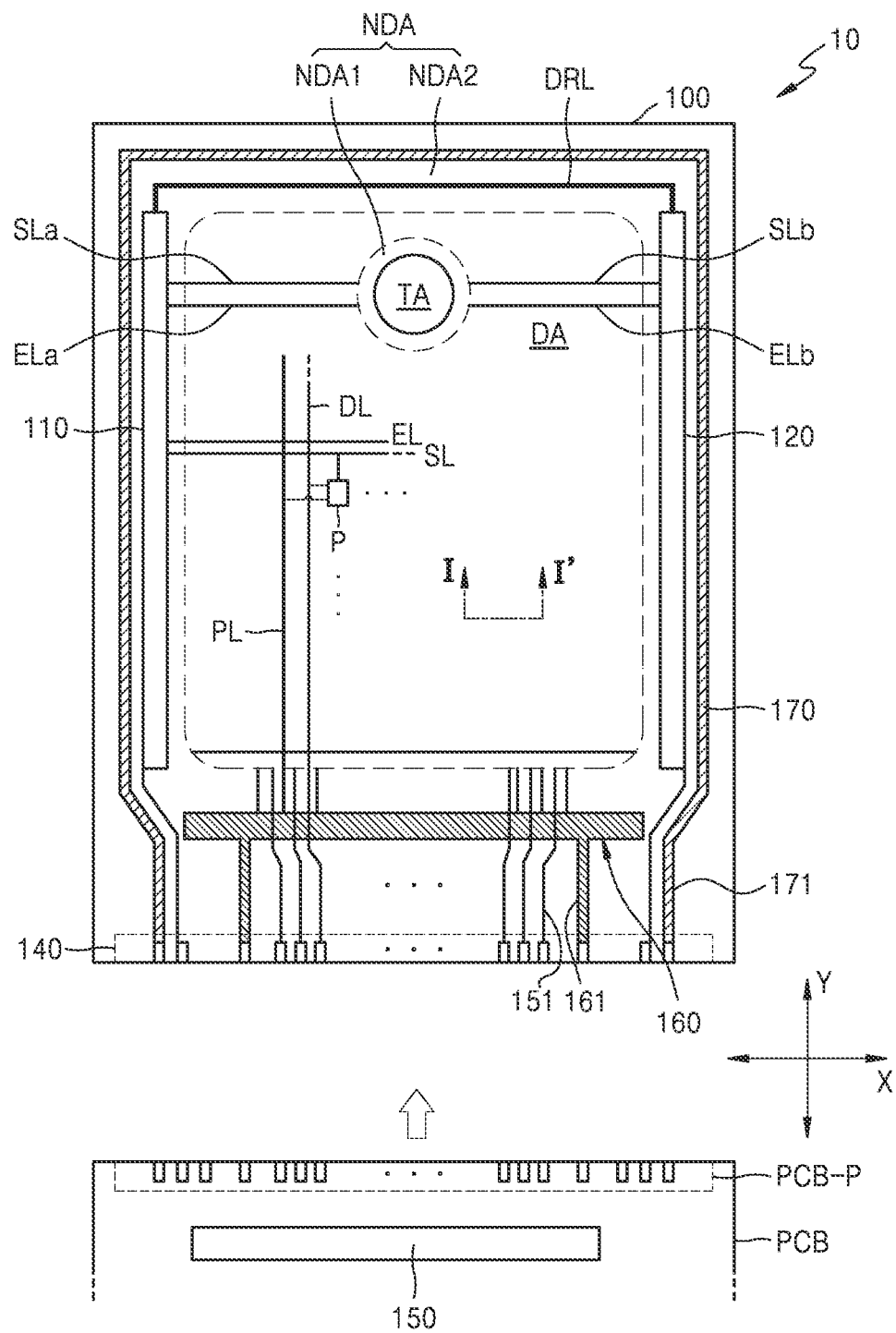
FIG. 4 is a plan view of a display panel according to some example embodiments.

FIG. 4 is a plan view of the display panel 10 according to some example embodiments.

Referring to FIG. 4, the display panel 10 includes a plurality of pixels P arranged in the display area DA. Each of the pixels P may include a display element such as an organic light-emitting diode. Each pixel P may emit, for example, red, green, blue, or white light through an organic light-emitting diode. In the present specification, a pixel P may be a sub-pixel that emits red, green, blue, or white light as described above. The display area DA may be covered by the encapsulation member described with reference to FIGS. 2A to 3C and protected from external contaminants, such as air or moisture.

The transmission area TA may be arranged at a center of the display area DA in a width direction (a first direction) and partially surrounded by the display area DA. Therefore, a plurality of pixels P may be arranged around the transmission area TA. The plurality of pixels P may surround at least a portion of the transmission area TA. The first non-display area NDA1 in which the pixels P are not arranged is located between the transmission area TA and the display area DA. Wirings may detour around the first non-display area NDA1, the wirings applying a signal or power (e.g., a set or predetermined signal or power) to the pixels P apart from each other around the transmission area TA. Also, some wirings may be disconnected with the transmission area TA therebetween.

Each pixel P may be electrically connected to built-in circuits arranged in the second non-display area NDA2. A first scan driving circuit 110, a second scan driving circuit 120, a terminal unit 140, a data driving circuit 150, a first power supply line 160, and a second power supply line 170 may be arranged in the second non-display area NDA2.

The first scan driving circuit 110 may supply a scan signal to each pixel P through a scan line SL. The first scan driving circuit 110 may provide an emission control signal to each pixel P through an emission control line EL. The second scan driving circuit 120 may be parallel to the first scan driving circuit 110 with the display area DA therebetween. Some of the pixels P arranged in the display area DA may be electrically connected to the first scan driving circuit 110, and the rest of the pixels P may be connected to the second scan driving circuit 120.

The first scan driving circuit 110 may be connected to the second scan driving circuit 120 by a driver line DRL. The driver line DRL may be provided as a plurality of driver lines. The driver lines each may transmit a gate driving high voltage Vgh, a gate driving low voltage Vgl, a start signal FLM, etc. Here, the gate driving high voltage Vgh and the gate driving low voltage Vgl may be voltages for driving the first scan driving circuit 110 and the second scan driving circuit 120. Because the first scan driving circuit 110 is connected to the second scan driving circuit 120 by the driver line DRL, a brightness deviation of the display device 1 may be minimized or reduced.

The terminal unit 140 may be arranged on one side of the substrate 100. The terminal unit 140 may be exposed and electrically connected to a printed circuit board PCB by not being covered by an insulating layer. A terminal PCB-P of the printed circuit board PCB may be electrically connected to the terminal unit 140 of the display panel 10. The printed circuit board PCB transfers a signal of a controller or power to the display panel 10. A control signal generated by the controller may be transferred to the first and second scan driving circuits 110 and 120 through the printed circuit board PCB. The controller may respectively provide a driving voltage ELVDD (also referred to as a first power voltage) and a common voltage ELVSS (see FIGS. 5A and 5B below) through first and second connection lines 161 and 171.

The driving voltage ELVDD may be provided to each pixel P through a driving voltage line PL connected to the first power supply line 160, and the common voltage ELVSS may be provided to an opposite electrode of a pixel P that is connected to the second power supply line 170. The second power supply line 170 has a loop shape having one open side and may partially surround the display area DA.

The data driving circuit 150 is electrically connected to the data line DL. A data signal of the data driving circuit 150 may be provided to each pixel P through a connection line 151 connected to the terminal unit 140, and the data line DL connected to the connection line 151. Though it is shown in FIG. 4 that the data driving circuit 150 is arranged on the printed circuit board PCB, the data driving circuit 150 may be arranged on the substrate 100 according to some example embodiments. For example, the data driving circuit 150 may be arranged between the terminal unit 140 and the first power supply line 160.

The first power supply line 160 may be connected to the first connection line 161 and may receive the driving voltage ELVDD from the controller connected to the terminal unit 140. The first power supply line 160 may be arranged so as to correspond to all pixels P arranged in the first direction and may transfer the driving voltage ELVDD to each column of pixels P.

According to some example embodiments, a first scan line SLa on the left of the transmission area TA may be spaced apart from a second scan line SLb that is co-linear with the first scan line SLa on the right of the transmission area TA with the transmission area TA therebetween. Also, a first emission control line ELa on the left of the transmission area TA may be spaced apart from a second emission control line ELb that is co-linear with the first emission control line Ela on the right of the transmission area TA with the transmission area TA therebetween.

In this case, lengths of the first scan line SLa and the second scan line SLb arranged on the same line (e.g., are co-linear) may be substantially the same, and lengths of the first emission control line ELa and the second emission control line ELb arranged on the same line may be substantially the same. Because the lengths of the first scan line SLa and the second scan line SLb are substantially the same, the brightness of the pixels arranged on the left and the right of the transmission area TA may be relatively uniform. Therefore, the first scan line SLa may not be connected to the second scan line SLb. Likewise, the first emission control line ELa may not be connected to the second emission control line ELb.

The first scan line SLa and the first emission control line ELa may be connected to the first scan driving circuit 110 and may extend in a (+) first direction (an X-direction). The second scan line SLa and the second emission control line ELb may be connected to the second scan driving circuit 120 and may extend in a (−) first direction (a (−) X-direction).

Figure 5A:
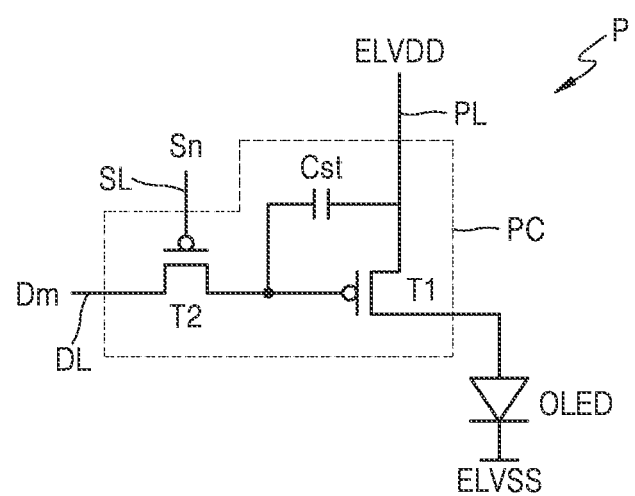
FIGS. 5A and 5B are equivalent circuit diagrams of one pixel of a display device according to some example embodiments.
Figure 5B:
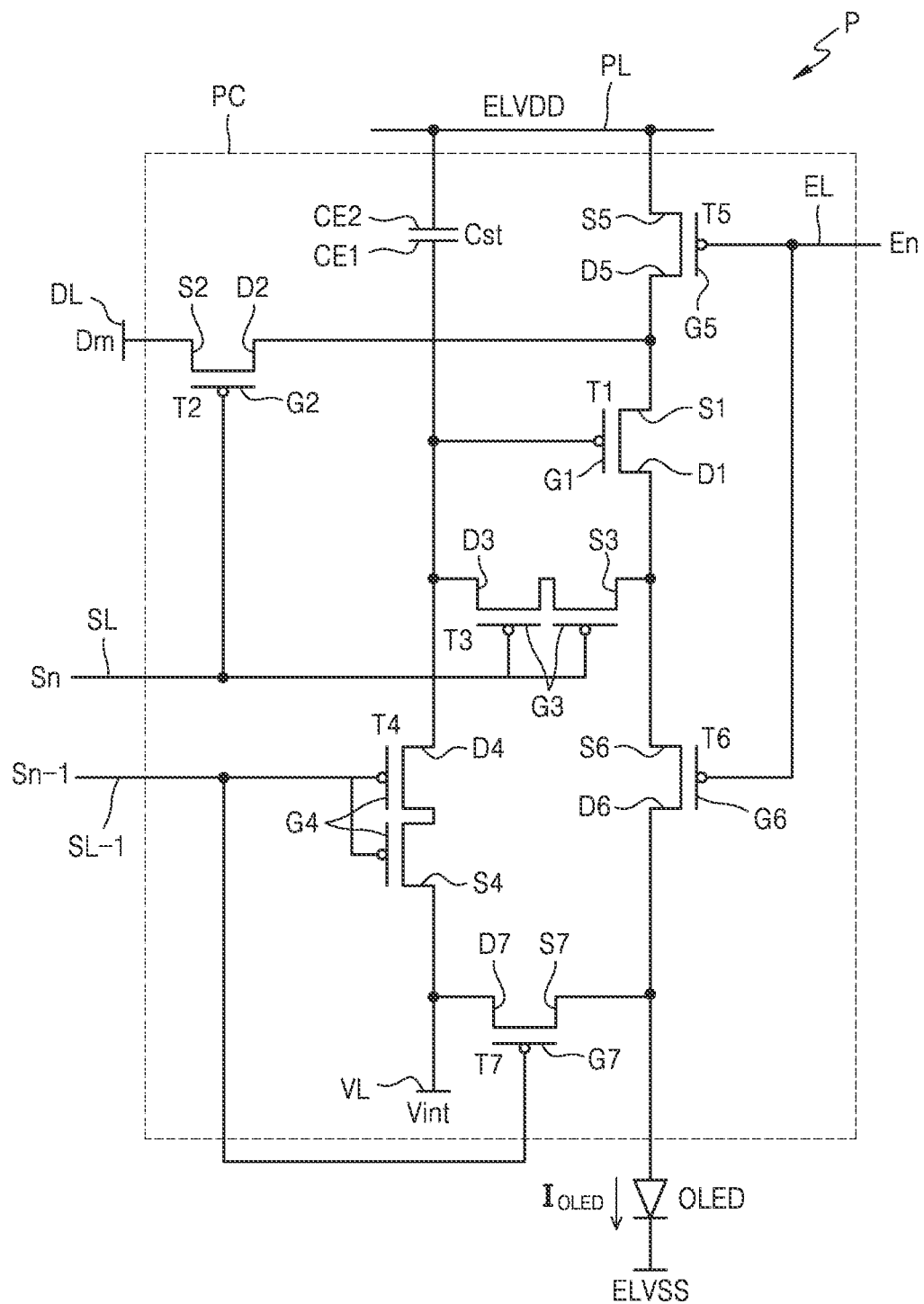

FIGS. 5A and 5B are equivalent circuit diagrams of one pixel of a display device according to some example embodiments.

Referring to FIG. 5A, each pixel P includes a pixel circuit PC and an organic light-emitting diode OLED, the pixel circuit PC being connected to the scan line SL and the data line DL, and the organic light-emitting diode OLED being connected to the pixel circuit PC.

The pixel circuit PC includes a driving thin film transistor T1, a switching thin film transistor T2, and a storage capacitor Cst. The switching thin film transistor T2 is connected to the scan line SL and the data line DL and transfers a data signal Dm input through the data line DL to the driving thin film transistor T1 in response to a scan signal Sn input through the scan line SL.

The storage capacitor Cst is connected to the switching thin film transistor T2 and the driving voltage line PL and stores a voltage corresponding to a difference between a voltage transferred from the switching thin film transistor T2 and the first power voltage ELVDD (or the driving voltage) supplied to the driving voltage line PL.

The driving thin film transistor T1 may be connected to the driving voltage line PL and the storage capacitor Cst and may control a driving current flowing through the organic light-emitting diode OLED from the driving voltage line PL in response to the voltage stored in the storage capacitor Cst.

The organic light-emitting diode OLED may emit light (e.g., having a set or predetermined brightness) by using the driving current.

Though it is shown in FIG. 5A that the pixel circuit PC includes two thin film transistors and one storage capacitor, the number of thin film transistors and the number of storage capacitors may be variously changed according to some example embodiments.

For example, as shown in FIG. 5B, the pixel circuit PC may include seven thin film transistors and one storage capacitor.

Referring to FIG. 5B, a pixel P includes the pixel circuit PC and the organic light-emitting diode OLED connected to the pixel circuit PC. The pixel circuit PC may include a plurality of thin film transistors and a storage capacitor. The thin film transistors and the storage capacitor may be connected to signal lines SL, SL-1, EL, and DL, an initialization voltage line VL, and the driving voltage line PL.

Though it is shown in FIG. 5B that each pixel P is connected to the signal lines SL, SL-1, EL, and DL, the initialization voltage line VL, and the driving voltage line PL, the embodiments are not limited thereto. According to some example embodiments, at least one of the signal lines SL, SL-1, EL, or DL, the initialization voltage line VL, or the driving voltage line PL may be shared by pixels that neighbor each other.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The signal lines include the scan line SL, a previous scan line SL-1, the emission control line EL, and the data line DL, the scan line SL transferring a scan signal Sn, the previous scan line SL-1 transferring a previous scan signal Sn-1 to the first initialization thin film transistor T4 and the second initialization thin film transistor T7, the emission control line EL transferring an emission control signal En to the operation control thin film transistor T5 and the emission control thin film transistor T6, and the data line DL intersecting with the scan line SL and transferring a data signal Dm. The driving voltage line PL transfers the driving voltage ELVDD to the driving thin film transistor T1, and the initialization voltage line VL transfers an initialization voltage Vint initializing the driving thin film transistor T1 and a pixel electrode of the organic light-emitting diode OLED.

A driving gate electrode G1 of the driving thin film transistor T1 is connected to a first electrode CE1 of the storage capacitor Cst, a driving source electrode S1 of the driving thin film transistor T1 is connected to the driving voltage line PL through the operation control thin film transistor T5, and a driving drain electrode D1 of the driving thin film transistor T1 is electrically connected to the pixel electrode (or anode) of an organic light-emitting diode OLED through the emission control thin film transistor T6. The driving thin film transistor T1 receives a data signal Dm depending on a switching operation of the switching thin film transistor T2 (which turns on and off according to a scan signal supplied by a scan line SL) and supplies a driving current IOLED to the organic light-emitting diode OLED.

A switching gate electrode G2 of the switching thin film transistor T2 is connected to the scan line SL, a switching source electrode S2 of the switching thin film transistor T2 is connected to the data line DL, and a switching drain electrode D2 of the switching thin film transistor T2 is connected to the driving source electrode S1 of the driving thin film transistor T1 and concurrently (or simultaneously) connected to the driving voltage line PL through the operation control thin film transistor T5. The switching thin film transistor T2 is turned on in response to a scan signal Sn transferred through the scan line SL and performs a switching operation of transferring a data signal Dm transferred through the data line DL to the driving source electrode S1 of the driving thin film transistor T1.

A compensation gate electrode G3 of the compensation thin film transistor T3 is connected to the scan line SL, a compensation source electrode S3 of the compensation thin film transistor T3 is connected to the driving drain electrode D1 of the driving thin film transistor T1 and concurrently (or simultaneously) connected to the pixel electrode of the organic light-emitting diode OLED through the emission control thin film transistor T6, and a compensation drain electrode D3 of the compensation thin film transistor T3 is connected to the first electrode CE1 of the storage capacitor Cst, a first initialization drain electrode D4 of the first initialization thin film transistor T4, and the driving gate electrode G1 of the driving thin film transistor T1. The compensation thin film transistor T3 is turned on in response to a scan signal Sn transferred through the scan line SL and diode-connects the driving thin film transistor T1 by electrically connecting the driving gate electrode G1 to the driving drain electrode D1 of the driving thin film transistor T1.

A first initialization gate electrode G4 of the first initialization thin film transistor T4 is connected to the previous scan line SL-1, a first initialization source electrode S4 of the first initialization thin film transistor T4 is connected to a second initialization drain electrode D7 of the second initialization thin film transistor T7 and the initialization voltage line VL, and a first initialization drain electrode D4 of the first initialization thin film transistor T4 is connected to the first electrode CE1 of the storage capacitor Cst, the compensation drain electrode D3 of the compensation thin film transistor T3, and the driving gate electrode G1 of the driving thin film transistor T1. The first initialization thin film transistor T4 is turned on in response to a previous scan signal Sn-1 transferred through the previous scan line SL-1 and performs an initialization operation of transferring an initialization voltage Vint to the driving gate electrode G1 of the driving thin film transistor T1, thereby initializing a voltage of the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the driving voltage line PL, and an operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and the compensation source electrode S3 of the compensation thin film transistor T3, and an emission control drain electrode D6 of the emission control thin film transistor T6 is connected to the second initialization source electrode S7 of the second initialization thin film transistor T7 and the pixel electrode of the organic light-emitting diode OLED.

The operation control thin film transistor T5 and the emission control thin film transistor T6 are concurrently (or simultaneously) turned on in response to an emission control signal En transferred through the emission control line EL to allow the driving voltage ELVDD to be transferred to the organic light-emitting diode OLED and thus the driving current IOLED to flow through the organic light-emitting diode OLED.

A second initialization gate electrode G7 of the second initialization thin film transistor T7 is connected to the previous scan line SL-1, the second initialization source electrode S7 of the second initialization thin film transistor T7 is connected to the emission control drain electrode D6 of the emission control thin film transistor T6 and the pixel electrode of the organic light-emitting diode OLED, and the second initialization drain electrode D7 of the second initialization thin film transistor T7 is connected to the first initialization source electrode S4 of the first initialization thin film transistor T4 and the initialization voltage line VL. The second initialization thin film transistor T7 is turned on in response to a previous scan signal Sn-1 transferred through the previous scan line SL-1 and initializes the pixel electrode of the organic light-emitting diode OLED.

Though FIG. 5B shows the case where the first initialization thin film transistor T4 and the second initialization thin film transistor T7 are connected to the previous scan line SL-1, the embodiments are not limited thereto. According to some example embodiments, the first initialization thin film transistor T4 may be connected to the previous scan line SL-1 and driven in response to a previous scan signal Sn-1, and the second initialization thin film transistor T7 may be connected to a separate signal line (for example, the next scan line) and driven in response to a signal transferred through the separate signal line.

A second electrode CE2 of the storage capacitor Cst is connected to the driving voltage line PL, and an opposite electrode of the organic light-emitting diode OLED is connected to the common voltage ELVSS. Therefore, the organic light-emitting diode OLED may receive the driving current IOLED from the driving thin film transistor T1 and emit light to thereby display an image.

Though it is shown in FIG. 5B that the compensation thin film transistor T3 and the first initialization thin film transistor T4 each have a dual gate electrode, the compensation thin film transistor T3 and the first initialization thin film transistor T4 each may have one gate electrode.

Figure 6A:
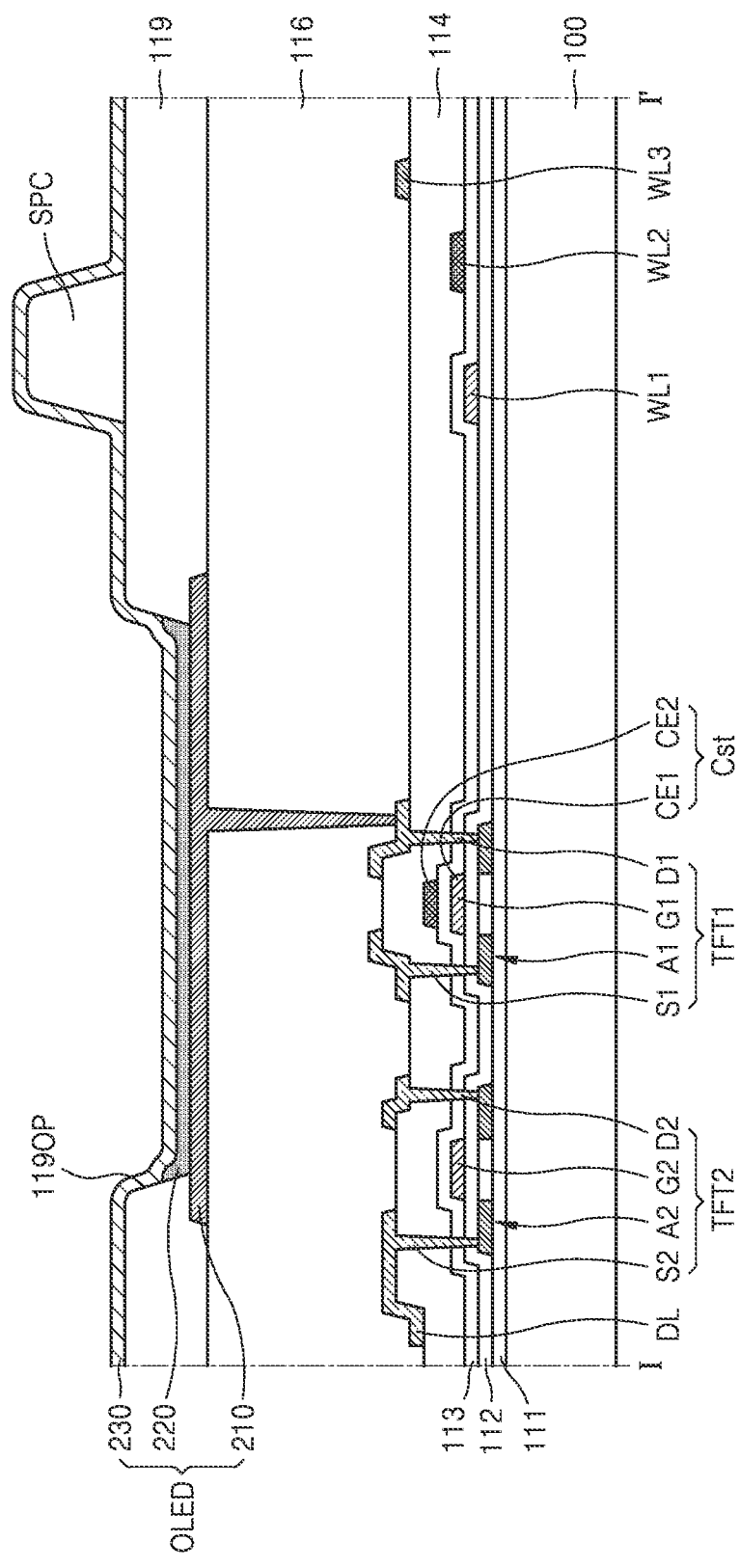
FIGS. 6A to 6C are cross-sectional views of a display device taken along the line I-I' of FIG. 4.
Figure 6B:
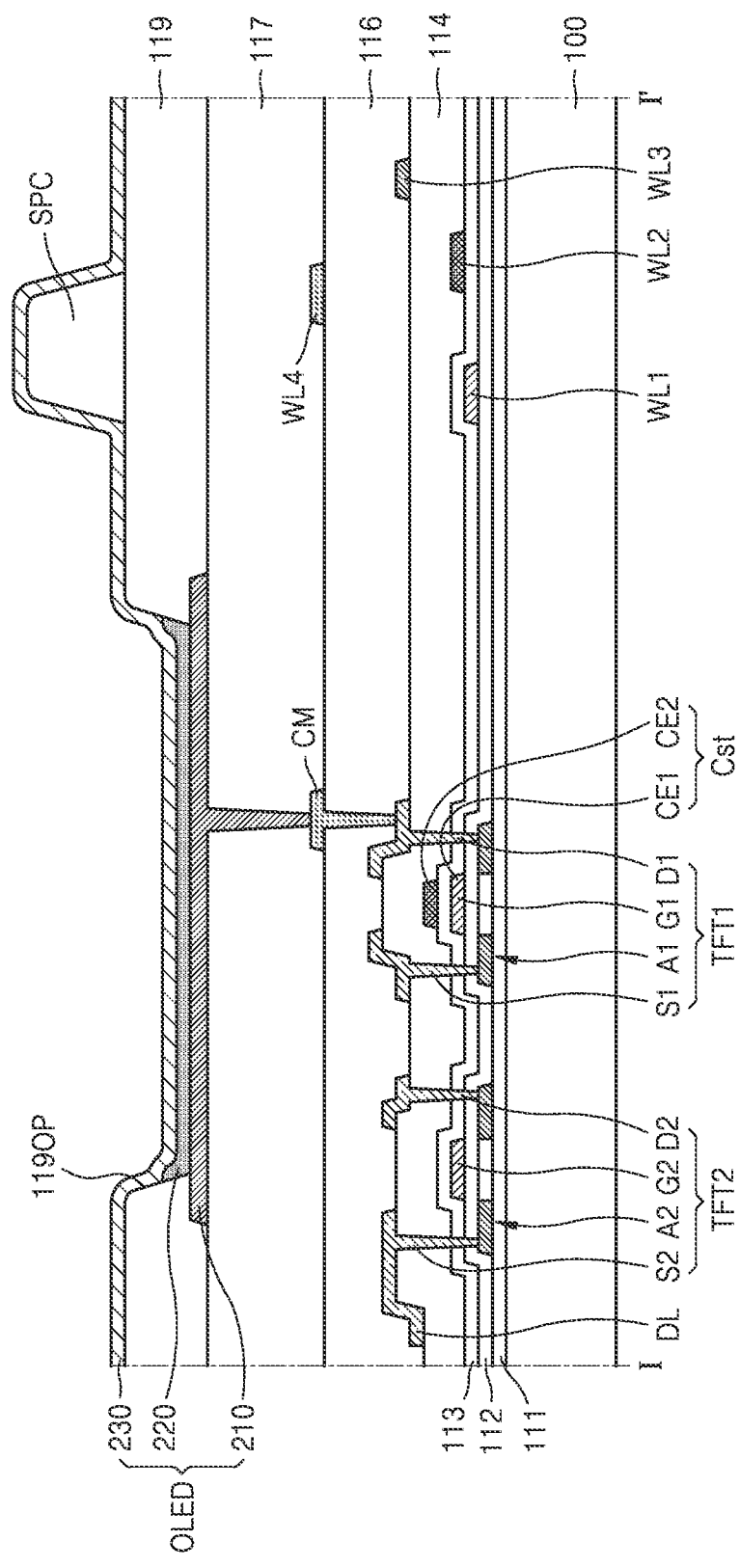
Figure 6C:
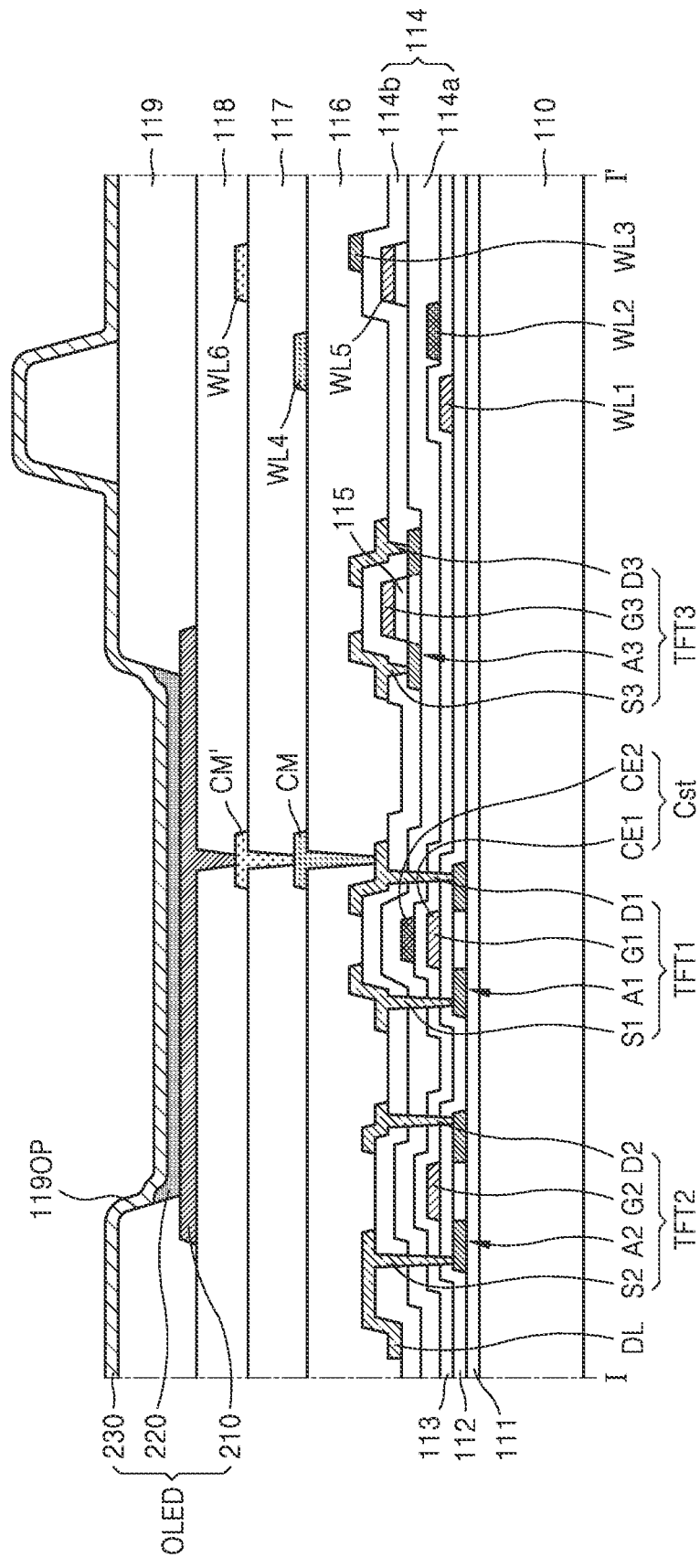

FIGS. 6A to 6C are cross-sectional views of a portion of a stacked structure of a display device according to some example embodiments.

Referring to FIG. 6A, the display device may include the substrate 100, first and second thin film transistors TFT1 and TFT2 arranged over the substrate 100, a storage capacitor Cst, an organic light-emitting diode OLED, and first to third wiring lines WL1, WL2, and WL3.

A buffer layer 111 may be arranged on the substrate 100. The buffer layer 111 may reduce or block penetration of foreign substances or contaminants, such as moisture, or external air from below the substrate 100 and provide a flat surface on the substrate 100. The buffer layer 111 may include an inorganic material such as oxide or nitride, an organic material, or an organic/inorganic composite material and include a single-layered structure or a multi-layered structure including an inorganic material and an organic material. A barrier layer may be further provided between the substrate 100 and the buffer layer 111, the barrier layer blocking the penetration of external air.

The first thin film transistor TFT1 may include a first semiconductor layer A1, a first gate electrode G1, a first source electrode S1, and a first drain electrode D1, and the second thin film transistor TFT2 may include a second semiconductor layer A2, a second gate electrode G2, a second source electrode S2, and a second drain electrode D2. The first thin film transistor TFT1 may be connected to the organic light-emitting diode OLED and may serve as a driving thin film transistor driving the organic light-emitting diode OLED. The second thin film transistor TFT2 may be connected to the data line DL and may serve as a switching thin film transistor. Though two thin film transistors are shown in the drawing, the embodiments are not limited thereto. The number of thin film transistors may be 2 to 7. Various modifications may be made.

The first semiconductor layer A1 and the second semiconductor layer A2 may include amorphous silicon or polycrystalline silicon. According to some example embodiments, the first and second semiconductor layers A1 and A2 may include an oxide of at least one of indium (In), gallium (Ga), stannum (Sn), zirconium (Zr), vanadium (V), hafnium (Hf), cadmium (Cd), germanium (Ge), chrome (Cr), titanium (Ti), or zinc (Zn). Each of the first and second semiconductor layers A1 and A2 may include a channel region, a source region, and a drain region, the source region and the drain region being doped with impurities.

The first gate electrode G1 and the second gate electrode G2 may be respectively arranged over the first semiconductor layer A1 and the second semiconductor layer A2 with a first gate insulating layer 112 therebetween. The first gate electrode G1 and the second gate electrode G2 may include at least one of molybdenum (Mo), aluminum (Al), copper (Cu), or titanium (Ti) and include a single layer or a multi-layer. For example, each of the first gate electrode G1 and the second gate electrode G2 may be a single Mo layer.

The first gate insulating layer 112 may include $SiO_2$, $SiN_x$, SiON, $Al_2O_3$, $TiO_2$, $Ta_2O_5$, $HfO_2$, or $ZnO_2$.

A second gate insulating layer 113 may be provided so as to cover the first gate electrode G1 and the second gate electrode G2. The second gate insulating layer 113 may include $SiO_2$, $SiN_x$, SiON, $Al_2O_3$, $TiO_2$, $Ta_2O_5$, $HfO_2$, or $ZnO_2$.

The first electrode CE1 of the storage capacitor Cst may overlap the first thin film transistor TFT1. For example, the first gate electrode G1 of the first thin film transistor TFT1 may serve as the first electrode CE1 of the storage capacitor Cst.

The second electrode CE2 of the storage capacitor Cst overlaps the first electrode CE1 with the second gate insulating layer 113 therebetween. In this case, the second gate insulating layer 113 may serve as a dielectric layer of the storage capacitor Cst. The second electrode CE2 may include a conductive material including Mo, Al, Cu, and Ti and include a single layer or a multi-layer including the above materials. For example, the second electrode CE2 may include a single Mo layer or a multi-layer of Mo/Al/Mo.

The first source electrode S1, the first drain electrode D1, the second source electrode S2, and the second drain electrode D2 may be arranged on an interlayer insulating layer 114. The first source electrode S1, the first drain electrode D1, the second source electrode S2, and the second drain electrode D2 may include a conductive material including Mo, Al, Cu, and Ti and include a single layer or a multi-layer including the above materials. For example, the first source electrode S1, the first drain electrode D1, the second source electrode S2, and the second drain electrode D2 may have a multi-layered structure of Ti/Al/Ti.

A first planarization layer 116 may be located on the first source electrode S1, the first drain electrode D1, the second source electrode S2, and the second drain electrode D2. The organic light-emitting diode OLED may be located on the first planarization layer 116.

The first planarization layer 116 may have a flat top surface such that a pixel electrode 210 is formed flat. The first planarization layer 116 may include a single layer or a multi-layer including an organic material. The first planarization layer 116 may include a general-purpose polymer such as benzocyclobutene (BCB), polyimide, polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The organic light-emitting diode OLED is arranged on the first planarization layer 116. The organic light-emitting diode OLED includes the pixel electrode 210, an intermediate layer 220, and an opposite electrode 230, the intermediate layer 220 including an organic emission layer.

A via hole is provided in the first planarization layer 116, the via hole exposing one of the first source electrode S1 and the first drain electrode D1 of the first thin film transistor TFT1. The pixel electrode 210 may be electrically connected to the first thin film transistor TFT1 by contacting the first source electrode S1 or the first drain electrode D1 through the via hole.

The pixel electrode 210 may include a transparent electrode or a reflective electrode. According to some example embodiments, the pixel electrode 210 may include a reflective layer and a transparent or semi-transparent electrode layer on the reflective layer, the reflective layer including at least one of silver (Ag), magnesium (Mg), aluminum (Al), platinum (Pt), palladium (Pd), gold (Au), nickel (Ni), neodymium (Nd), iridium (Ir), chrome (Cr), or a compound thereof. The transparent or semi-transparent electrode layer may include at least one of indium tin oxide (ITO), zinc oxide (IZO), zinc oxide (ZnO), indium oxide ($In_2O_3$), indium gallium oxide (IGO), or aluminum zinc oxide (AZO)

A pixel-defining layer 119 may be arranged on the first planarization layer 116. The pixel-defining layer 119 may define an emission area of a pixel by including an opening 119OP corresponding to each sub-pixel, that is, the opening 119OP exposing at least a central portion of the pixel electrode 210. Also, the pixel-defining layer 119 may prevent an arc, etc. from occurring at edges of the pixel electrode 210 by increasing a distance between the edges of the pixel electrode 210 and the opposite electrode 230 over the pixel electrode 210. The pixel-defining layer 119 may include at least one organic insulating material such as polyimide, polyamide, an acrylic resin, BCB, and a phenolic resin. The pixel-defining layer 119 may be formed by a method such as spin coating.

A spacer SPC may be arranged on the pixel-defining layer 119. The spacer SPC may be arranged between a plurality of display elements and may protrude in a direction away from the substrate 100. According to some example embodiments, the spacer SPC may be an element for preventing chopping during a mask process. According to some example embodiments, the spacer SPC may change a light path. The spacer SPC may include at least one organic insulating material such as polyimide, polyamide, an acrylic resin, BCB, and a phenolic resin. The spacer SPC may be formed by a method such as spin coating. According to some example embodiments, the spacer SPC may be formed concurrently (e.g., simultaneously) with the pixel-defining layer 119 by using the same material as that of the pixel-defining layer 119 during a process that uses a half-tone mask.

The intermediate layer 220 of the organic light-emitting diode OLED may include an organic emission layer. The organic emission layer may include an organic material including a fluorescent or phosphorous material emitting red, green, blue, or white light. The organic emission layer may include a low molecular weight organic material or a polymer organic material. Functional layers may be selectively further arranged under and on the organic emission layer, the functional layers including a hole transport layer (HTL), a hole injection layer (HIL), an electron transport layer (ETL), and an electron injection layer (EIL). According to some example embodiments, the intermediate layer 220 may correspond to each of the plurality of pixel electrodes 210. According to some example embodiments, the intermediate layer 220 may include a layer which is one body over the plurality of pixel electrodes 210. For example, the organic emission layer may correspond to each of the plurality of pixel electrodes 210, and a functional layer on and/or under the organic emission layer may be provided as one body over the plurality of pixels. According to some example embodiments, the intermediate layer 220 may be provided as one body over the plurality of pixel electrodes 210.

The opposite electrode 230 may include a transparent electrode or a reflective electrode. According to some example embodiments, the opposite electrode 230 may include a transparent or semi-transparent electrode and may include a metal thin layer having a small work function and including at least one of lithium (Li), calcium (Ca), lithium fluoride (LiF)/Ca, LiF/Al, Al, Ag, Mg, or a compound thereof. Also, a transparent conductive oxide (TCO) layer including ITO, IZO, ZnO, or $In_2O_3$ may be further arranged on the metal thin layer. The opposite electrode 230 may be provided as one body over the plurality of organic light-emitting diodes OLED and may correspond to the plurality of pixel electrodes 210.

A capping layer and/or a protective layer may be further arranged on the opposite electrode 230, the capping layer improving light extraction efficiency, and the protective layer protecting the organic light-emitting diode OLED during a subsequent process.

The first to third wiring lines WL1, WL2, and WL3 may transfer an electrical signal and/or a constant voltage to the first and second thin film transistors TFT1 and TFT2 of the pixel circuit PC.

The first wiring line WL1 may be arranged on the first gate insulating layer 112, which is the same layer as a layer on which the first and second gate electrodes G1 and G2 are arranged, and may serve as scan lines SL and SL-1 (see FIGS. 5A and 5B) transferring a scan signal to the pixel circuit PC. Alternatively, the first wiring line WL1 may serve as the emission control line EL (see FIG. 5B).

The second wiring line WL2 may be arranged on the second gate insulating layer 113, which is the same layer as a layer on which the second electrode CE2 of the storage capacitor Cst is arranged, and may serve as the scan line SL and/or the emission control line EL.

The third wiring line WL3 may be arranged on the interlayer insulating layer 114 and may serve as the data line DL transferring a data signal to the pixel circuit PC. Alternatively, the third wiring line WL3 may serve as the driving voltage line PL (see FIGS. 5A and 5B) transferring the driving voltage to the pixel circuit PC.

FIG. 6B is a cross-sectional view of a portion of a display device applicable to embodiments. In FIG. 6B, because the same reference numerals as those of FIG. 6A represent the same members, some repeated description thereof may be omitted.

Referring to FIG. 6B, the display device may further include a second planarization layer 117 on the first planarization layer 116. Therefore, a fourth wiring line WL4 may be arranged between the first planarization layer 116 and the second planarization layer 117.

The second planarization layer 117 may have a flat top surface such that the pixel electrode 210 is formed flat. The second planarization layer 117 may include a single layer or a multi-layer including an organic material. The second planarization layer 117 may include a general-purpose polymer such as benzocyclobutene (BCB), polyimide, polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The organic light-emitting diode OLED is arranged on the second planarization layer 117. The pixel electrode 210 of the organic light-emitting diode OLED may be connected to the first thin film transistor TFT1 through a connection electrode CM arranged on the first planarization layer 116.

The fourth wiring line WL4 may be arranged on the first planarization layer 116. According to some example embodiments, the fourth wiring line WL4 may serve as the driving voltage line PL transferring the driving voltage to the pixel circuit PC. According to some example embodiments, the fourth wiring line WL4 may serve as the data line DL transferring a data signal to the pixel circuit PC.

FIG. 6C is a cross-sectional view of a portion of a display device according to some example embodiments. In FIG. 6C, because the same reference numerals as those of FIG. 6B represent the same members, some repeated description thereof may be omitted.

Referring to FIG. 6C, the display device according to some example embodiments may further include a third thin film transistor TFT3 in which a third semiconductor layer A3 is arranged on a layer different from the layer on which the first semiconductor layer A1 of the first thin film transistor TFT1 is arranged. Also, according to some example embodiments, the interlayer insulating layer 114 may include a first interlayer insulating layer 114a and a second interlayer insulating layer 114b. Also, a third planarization layer 118 may be further arranged on the second planarization layer 117.

The third thin film transistor TFT3 may include the third semiconductor layer A3, a third gate electrode G3, a third source electrode S3, and a third drain electrode D3. The third semiconductor layer A3 may be arranged on the first interlayer insulating layer 114a. That is, the third semiconductor layer A3 may be arranged on a layer different from the layer on which the first semiconductor layer A1 is arranged. The third semiconductor layer A3 may include a channel region, a source region, and a drain region, the source region and the drain region being on two opposite sides of the channel region. According to some example embodiments, the third semiconductor layer A3 may include an oxide semiconductor. For example, the third semiconductor layer A3 may include Zn oxide, In—Zn oxide, and Ga—In—Zn oxide as a Zn oxide-based material. Alternatively, the third semiconductor layer A3 may include an IGZO (In—Ga—Zn—O) semiconductor, an ITZO (In—Sn—Zn—O) semiconductor, or an IGTZO (In—Ga—Sn—Zn—O) semiconductor including ZnO containing a metal such as indium (In), gallium (Ga), and tin (Sn).

The source region and the drain region of the third semiconductor layer A3 may be formed by adjusting carrier concentration of an oxide semiconductor and making the oxide semiconductor conductive. For example, the source region and the drain region of the third semiconductor layer A3 may be formed by performing a plasma process that uses a hydrogen (H)-based gas, a fluorine (F)-based gas, or a combination thereof on the oxide semiconductor and increasing carrier concentration.

The third gate electrode G3 may overlap the channel region of the third semiconductor layer A3, and a third gate insulating layer 115 may be arranged between the third semiconductor layer A3 and the third gate electrode G3. That is, the third gate electrode G3 may be insulated from the third semiconductor layer A3 by the third gate insulating layer 115. The third gate insulating layer 115 may be patterned according to a shape of the third gate electrode G3.

The third gate insulating layer 115 may include an inorganic material including an oxide or a nitride. For example, the third gate insulating layer 115 may include $SiO_2$, $SiN_x$, SiON, $Al_2O_3$, $TiO_2$, $Ta_2O_5$, $HfO_2$, or $ZnO_2$. The third gate electrode G3 may be arranged on the third gate insulating layer 115 and may include a single layer or a multi-layer including at least one of Mo, Cu, or Ti.

The second interlayer insulating layer 114b may cover the third gate electrode G3 of the third thin film transistor TFT3 and may be arranged over a top surface of the substrate 100. The third source electrode S3 and the third drain electrode D3 may be arranged on the second interlayer insulating layer 114b.

The third source electrode S3 and the third drain electrode D3 may respectively contact the source region and the drain region of the third semiconductor layer A3 through contact holes passing through the second interlayer insulating layer 114b. The third source electrode S3 and the third drain electrode D3 may include a conductive material including Mo, Al, Cu, and Ti and include a single layer or a multi-layer including the above materials. The third source electrode S3 and the third drain electrode D3 may be arranged on the same layer as a layer on which the third wiring line WL3 is arranged.

The third gate insulating layer 115 may be arranged on the first interlayer insulating layer 114a, and a fifth wiring line WL5 may be arranged on the third gate insulating layer 115. The third gate insulating layer 115 may be patterned along a shape of the fifth wiring line WL5. According to some example embodiments, the fifth wiring line WL5 may serve as a scan line transferring a scan signal to the pixel circuit PC. According to some example embodiments, the fifth wiring line WL5 may serve as an emission control line transferring an emission control signal to the pixel circuit PC.

The third planarization layer 118 may be arranged between the second planarization layer 117 and the pixel electrode 210.

The third planarization layer 118 may have a flat top surface such that the pixel electrode 210 is formed flat. The third planarization layer 118 may include a single layer or a multi-layer including an organic material. The third planarization layer 118 may include a general-purpose polymer such as benzocyclobutene (BCB), polyimide, polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The organic light-emitting diode OLED is arranged on the third planarization layer 118. The pixel electrode 210 of the organic light-emitting diode OLED may be connected to the first thin film transistor TFT1 through an additional connection electrode CM' arranged on the second planarization layer 117 and the connection electrode CM arranged on the first planarization layer 116.

A sixth wiring line WL6 may be arranged on the second planarization layer 117. According to some example embodiments, the sixth wiring line WL6 may serve as the driving voltage line PL transferring the driving voltage to the pixel circuit PC. According to some example embodiments, the sixth wiring line WL6 may serve as the data line DL transferring a data signal to the pixel circuit PC.

Figure 7:
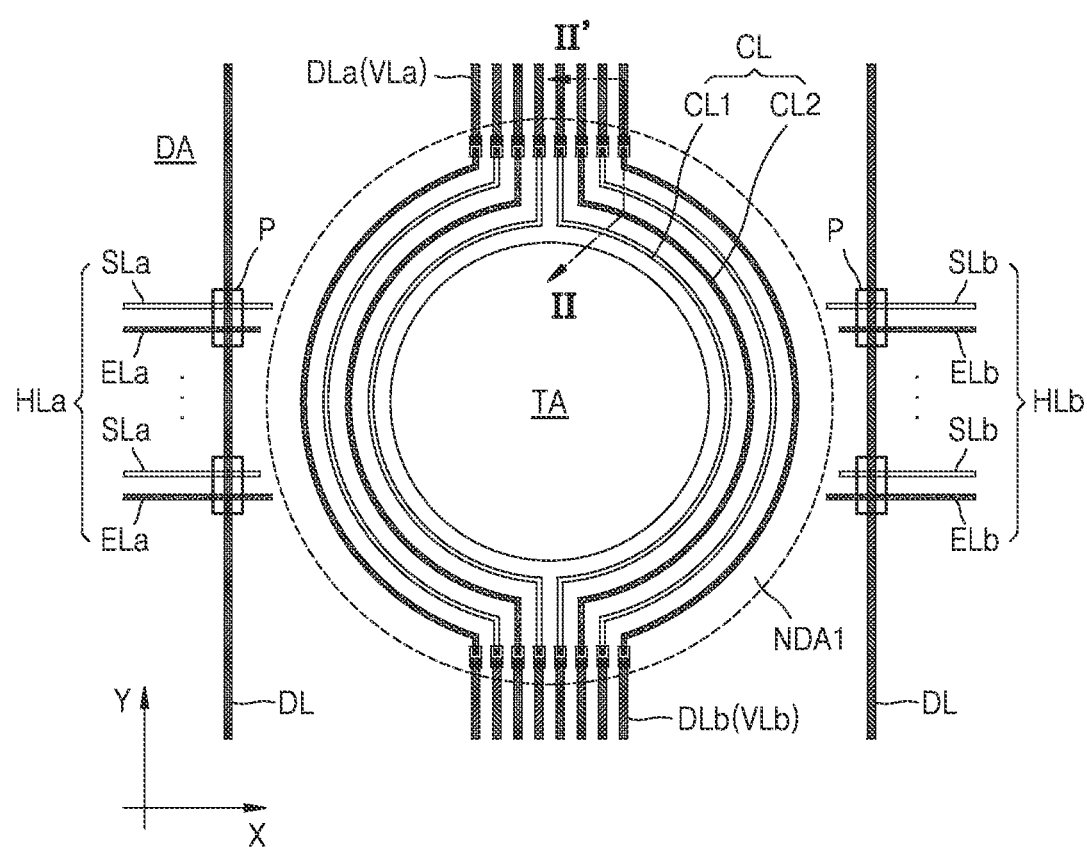
FIG. 7 is a plan view of wirings around a transmission area according to some example embodiments.
Figure 8A:
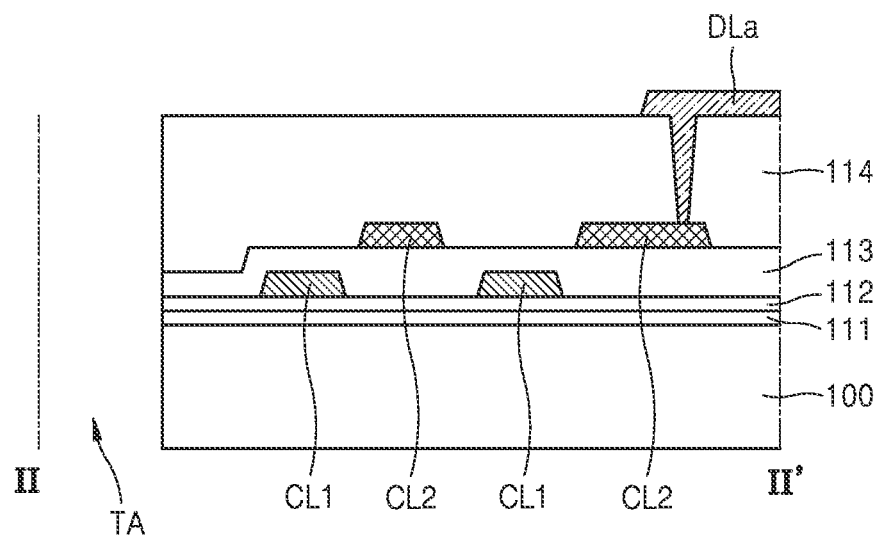
FIGS. 8A and 8B are cross-sectional views of the wirings taken along the line II-II' of FIG. 7.
Figure 8B:
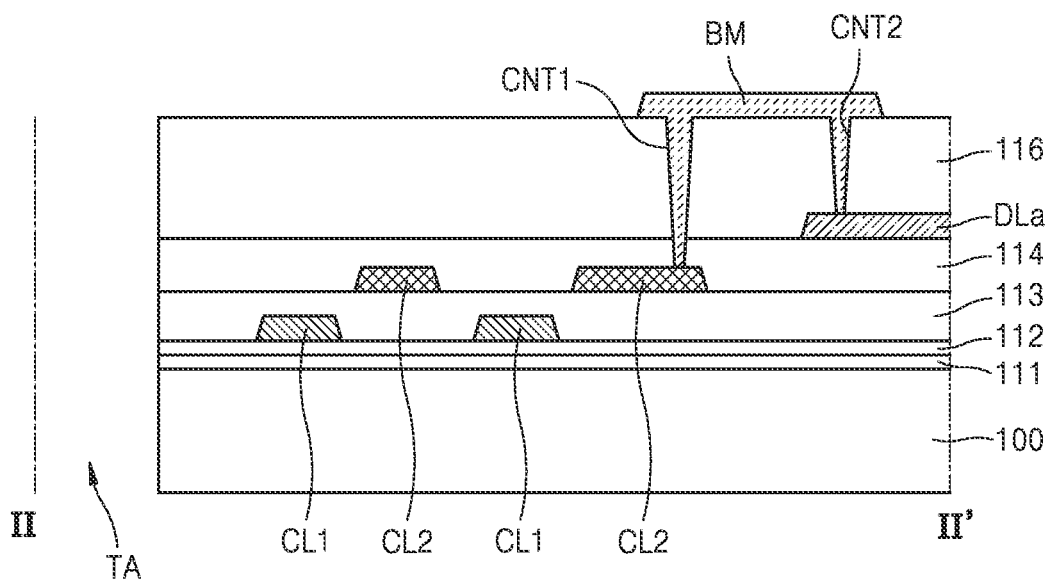

FIG. 7 is an enlarged plan view of wirings around the transmission area TA of the display device according to some example embodiments, and FIGS. 8A and 8B are cross-sectional views of the wirings taken along the line II-II' of FIG. 7.

Referring to FIG. 7, the first non-display area NDA1 is arranged around the transmission area TA, and the display area DA surrounds the transmission area TA and the first non-display area NDA1.

The plurality of pixels P and the plurality of signal lines may be arranged in the display area DA, the plurality of signal lines providing an electrical signal to the plurality of pixels P. The first and second scan lines SLa and SLb and the first and second emission control lines ELa and ELb may extend in the first direction, and the data lines DL may extend in the second direction (a Y-direction) intersecting with the first direction (the X-direction).

According to some example embodiments, wirings extending in the first direction and arranged on the left of the transmission area TA are referred to as first horizontal lines HLa, and wirings extending in the first direction and arranged on the right of the transmission area TA are referred to as second horizontal lines HLb. Also, wirings extending in the second direction and arranged above the transmission area TA are referred to as first vertical lines VLa, and wirings extending in the second direction and arranged below the transmission area TA are referred to as second vertical lines VLb.

The first horizontal lines HLa may include the first scan line SLa and the first emission control line ELa. Also, though not shown, the first horizontal lines HLa may further include a line on the left of the transmission area TA among the previous scan line described with reference to FIG. 5B and/or the next scan line.

The second horizontal line HLb may include the second scan line SLb and the second emission control line ELb. Also, the second horizontal lines HLb may further include a line on the right of the transmission area TA among the previous scan line described with reference to FIG. 5B and/or the next scan line.

The first vertical lines VLa may include a first data line DLa, and the second vertical lines VLb may include a second data line DLb.

The first scan line SLa on the left of the transmission area TA may be apart from the second scan line SLb on the right of the transmission area TA with the transmission area TA therebetween. Also, the first emission control line ELa on the left of the transmission area TA may be apart from the second emission control line ELb on the right of the transmission area TA with the transmission area TA therebetween.

According to some example embodiments, lengths of the first scan line SLa and the second scan line SLb arranged on the same line may be substantially the same, and lengths of the first emission control line ELa and the second emission control line ELb arranged on the same line may be substantially the same.

According to some example embodiments, the number of pixels connected to the first scan line SLa may be the same as the number of pixels connected to the second scan line SLb.

According to some example embodiments, a load applied to the first scan line SLa may be substantially the same as a load applied to the second scan line SLb.

According to some example embodiments, even though the first scan line SLa is not connected to the second scan line SLb, a delay in a scan signal may not occur between the pixels on the left of the transmission area TA and the pixels on the right of the transmission area TA.

That is, according to some example embodiments, even though the first scan lines SLa on the left of the transmission area TA are not connected to the second scan lines SLb on the right of the transmission area TA, a high-quality image may be displayed on the display area DA. Likewise, the first emission control line ELa may not be connected to the second emission control line ELb.

When the scan lines around the transmission area TA are not disconnected around the transmission area TA and are arranged so as to detour around the transmission area TA, the number of lines arranged in the first non-display area NDA1 increases and thus an area of the first non-display area NDA1 may increase. In contrast, according to some example embodiments, because at least some of the signal lines on the left of the transmission area TA may not be connected to at least some of the signal lines on the right of the transmission area TA, the area of the first non-display area NDA1 may be reduced.

Also, the first data line DLa above the transmission area TA may be apart from the second data line DLb below the transmission area TA with the transmission area TA therebetween. The first data lines DLa on the same line in the second direction may be connected to the second data lines DLb on the same line in the second direction by connection lines CL.

The connection lines CL may be arranged in the first non-display area NDA surrounding the transmission area TA. The connection line CL may extend in the second direction (the Y-direction) so as to connect the first data line DLa to the second data line DLb, and may detour along an edge of the transmission area TA in the first non-display area NDA1.

For example, in the case where the transmission area TA is provided in a circular shape, the connection lines CL may be curved with a curvature along the edge of the transmission area TA. Though it is shown in the drawing that the connection lines CL are curves of arcs, a detouring portion may be provided in a line bent in zigzags.

The first data line DLa may be apart from the second data line DLb around the transmission area TA so as to protect the pixels P from electrostatic discharge ESD that may occur in the neighborhood of the transmission area TA.

Static charges may gather around the transmission area TA that may include at least one opening, and there may be a high possibility that electrostatic discharge occurs. When wirings arranged around the transmission area TA are successively formed as one conductive layer, a large voltage due to electrostatic discharge may be directly applied to the pixels P.

In contrast, according to some example embodiments, because the first vertical lines VLa and the second vertical lines VLb arranged around the transmission area TA may be connected to each other by the connection lines CL, instances of a large voltage due to electrostatic discharge being directly applied to the pixels P may be prevented or reduced.

The connection lines CL may include a first connection line CL1 arranged on the same layer as a layer on which at least one of the first horizontal lines HLa is arranged. For example, the first connection line CL1 may be arranged on the same layer as a layer on which the first wiring line WL1 described with reference to FIGS. 6A to 6C is arranged. That is, the first connection line CL1 may be arranged on the same layer as a layer on which the first gate electrode G1 of the first thin film transistor TFT1 is arranged.

According to some example embodiments, the connection lines CL may further include a second connection line CL2 arranged on a layer different from the layer on which the first connection line CL1 is arranged. For example, the second connection line CL2 may be arranged on the same layer as a layer on which the second wiring line WL2 described with reference to FIGS. 6A to 6C is arranged. That is, the second connection line CL2 may be arranged on the same layer as the layer on which the second electrode CE2 of the storage capacitor Cst is arranged.

According to some example embodiments, the first connection line CL1 may be arranged on the same layer as a layer on which one of the second wiring line WL2 to the sixth wiring line WL6 is arranged, and the second connection line CL2 may be arranged on the same layer as a layer on which a wiring line among the first wiring line WL1 to the sixth wiring line WL6 is arranged, the wiring line being arranged on a layer different from the layer on which the first connection line CL1 is arranged.

The second connection line CL2 may be arranged on the same layer as a layer on which at least one of the first horizontal lines HLa is arranged. That is, some of the first horizontal lines HLa may be arranged on the same layer as a layer on which the first connection line CL1 is arranged, and others of the first horizontal lines HLa may be arranged on the same layer as a layer on which the second connection line CL2 is arranged.

According to some example embodiments, the first scan line SLa may be arranged on the same layer as a layer on which the first connection line CL1 is arranged, and the first emission control line ELa may be arranged on the same layer as a layer on which the second connection line CL2 is arranged. According to some example embodiments, some of the first scan lines SLa may be arranged on the same layer as a layer on which the first connection line CL1 is arranged, and others of the first scan lines SLa may be arranged on the same layer as a layer on which the second connection line CL2 is arranged.

The first connection lines CL1 and the second connection lines CL2 may be alternately arranged in the first non-display area NDA1. Because the first connection lines CL1 are arranged on a layer different from a layer on which the second connection lines CL2 are arranged, an interval between the first connection line CL1 and the second connection line CL2 may become narrow and thus an area of the first non-display area NDA1 may be reduced.

FIGS. 8A and 8B are cross-sectional views of the wirings taken along line II-II' of FIG. 7. In FIGS. 8A and 8B, because the same reference numerals as those of FIG. 6A represent the same members, some repeated description thereof may be omitted.

Referring to FIG. 8A, the first connection line CL1 may be arranged on the first gate insulating layer 112, and the second connection line CL2 may be arranged on the second gate insulating layer 113. That is, the second gate insulating layer 113 may be arranged between the first connection line CL1 and the second connection line CL2.

The first connection line CL1 and the second connection line CL2 may be alternately arranged in the first non-display area NDA1. Though it is shown in the drawing that the first connection line CL1 does not overlap the second connection line CL2, the first connection line CL1 may overlap the second connection line CL2 according to some example embodiments.

The first data line DLa, which is the first vertical line VLa, may be arranged on the interlayer insulating layer 114. In this case, the first data line DLa may be connected to the connection line CL through a contact hole CNT passing through the interlayer insulating layer 114.

According to some example embodiments, the first data line DLa may be connected to the connection line CL through a bridge metal BM arranged on a different layer.

For example, as shown in FIG. 8B, the bridge metal BM may be arranged on the first planarization layer 116 and connected to the connection line CL through a first contact hole CNT1 passing through the first planarization layer 116 and the interlayer insulating layer 114. Also, the bridge metal BM may be connected to the first data line DLa through a second contact hole CNT2 passing through the first planarization layer 116. According to some example embodiments, the connection line CL may not overlap the first data line DLa.

Figure 9A:
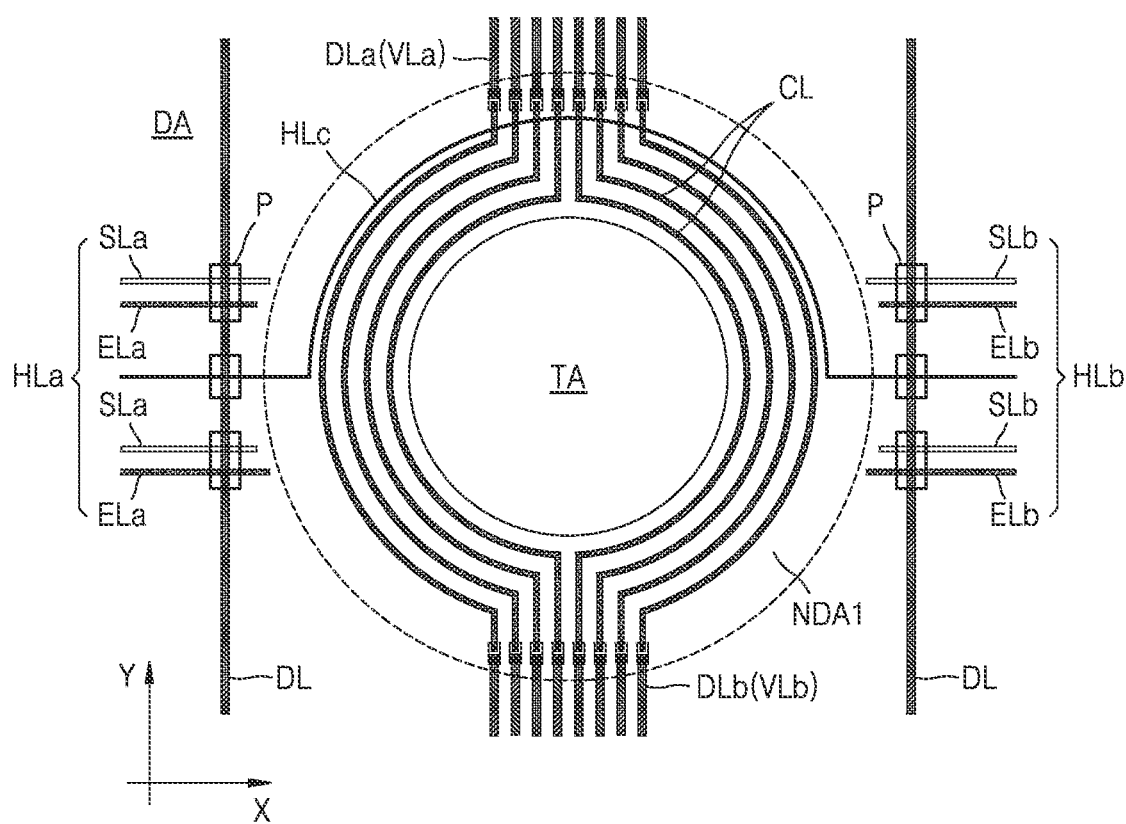
FIG. 9A is a plan view of a portion of a display device according to some example embodiments.
Figure 9B:
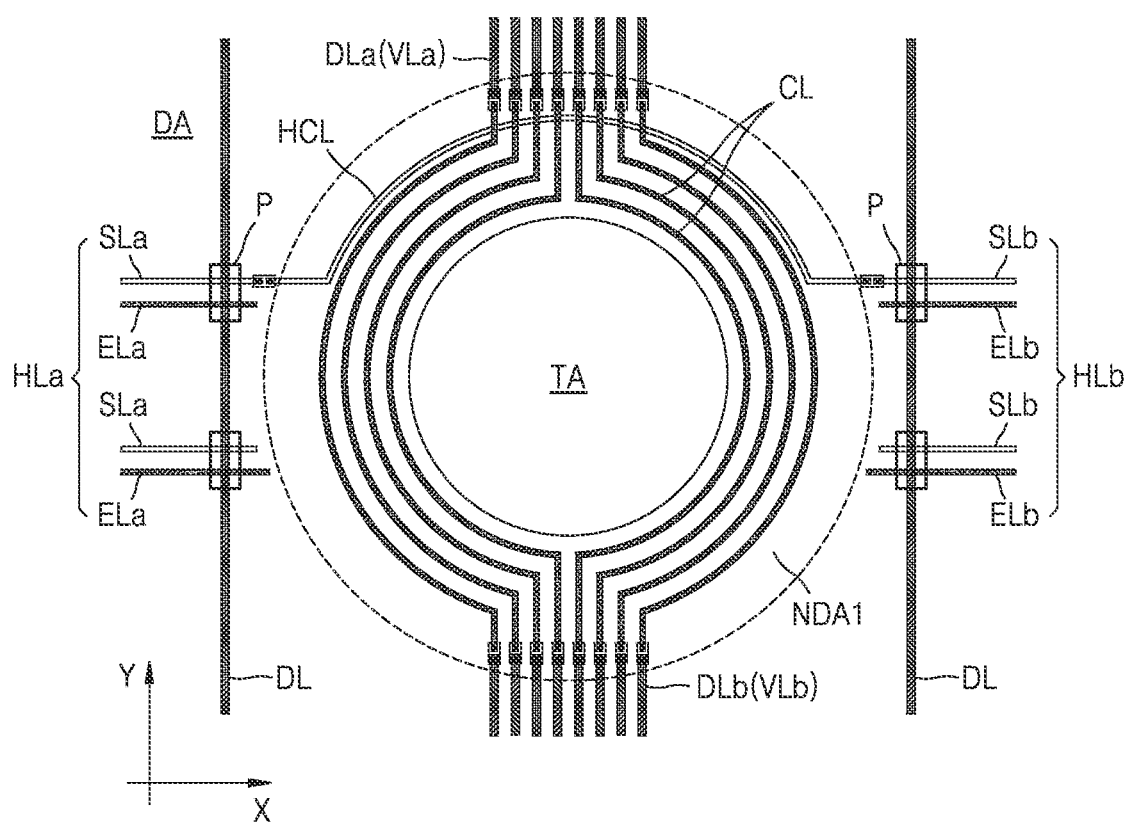
FIG. 9B is a plan view of a portion of a display device according to some example embodiments.

FIGS. 9A and 9B are plan views of a portion of a display device according to some example embodiments. For example, the surroundings of the transmission area TA are shown. In FIGS. 9A and 9B, because the same reference numerals as those of FIG. 7 represent the same members, some repeated description thereof may be omitted.

Referring to FIG. 9A, the display device may further include a third horizontal line HLc extending in the first direction from the display area DA and detouring around the transmission area TA. The third horizontal line HLc may be a scan line transferring a scan signal or an emission control line transferring an emission control signal.

The third horizontal line HLc may be arranged on a layer different from layers on which the connection lines CL are arranged.

According to some example embodiments, the third horizontal line HLc may be arranged on the same layer as a layer on which the first wiring line WL1 described with reference to FIGS. 6A to 6C is arranged, and the connection lines CL may be arranged on the same layer as a layer on which the second wiring line WL2 is arranged. According to some example embodiments, the third horizontal line HLc may be arranged on the same layer as a layer on which the second wiring line WL2 described with reference to FIGS. 6A to 6C is arranged, and the connection lines CL may be arranged on the same layer as a layer on which the first wiring line WL1 is arranged.

According to some example embodiments, the connection lines CL may include connection lines CL arranged on different layers. For example, in the case where the third horizontal line HLc is arranged on the same layer as a layer on which the first wiring line WL1 is arranged, some of the connection lines CL may be arranged on the same layer as a layer on which the second wiring line WL2 is arranged, and others of the connection lines CL may be arranged on the same layer as a layer on which the third wiring line WL3 is arranged.

Referring to FIG. 9B, the display device may further include a horizontal connection line HCL connecting at least one of the first horizontal lines SLa to at least one of the second horizontal lines SLb.

A line connected by the horizontal connection line HCL may be a scan line transferring a scan signal. Alternatively, a line connected by the horizontal connection line HCL may be an emission control line transferring an emission control signal.

According to some example embodiments, the horizontal connection line HCL may be arranged on a layer different from a layer on which the first horizontal line HLa and the second horizontal line HLb are arranged, and may be connected to the first horizontal line HLa and the second horizontal line HLb through a contact hole.

According to some example embodiments, the horizontal connection line HCL may be connected to the first horizontal line HLa and the second horizontal line HLb through the bridge metal. In this case, the horizontal connection line HCL may be arranged on the same layer as a layer on which the first horizontal line HLa is arranged.

According to some example embodiments, the horizontal connection line HCL may be arranged on the same layer as a layer on which the first wiring line WL1 or the second wiring line WL2 described with reference to FIGS. 6A to 6C is arranged.

Figure 10:
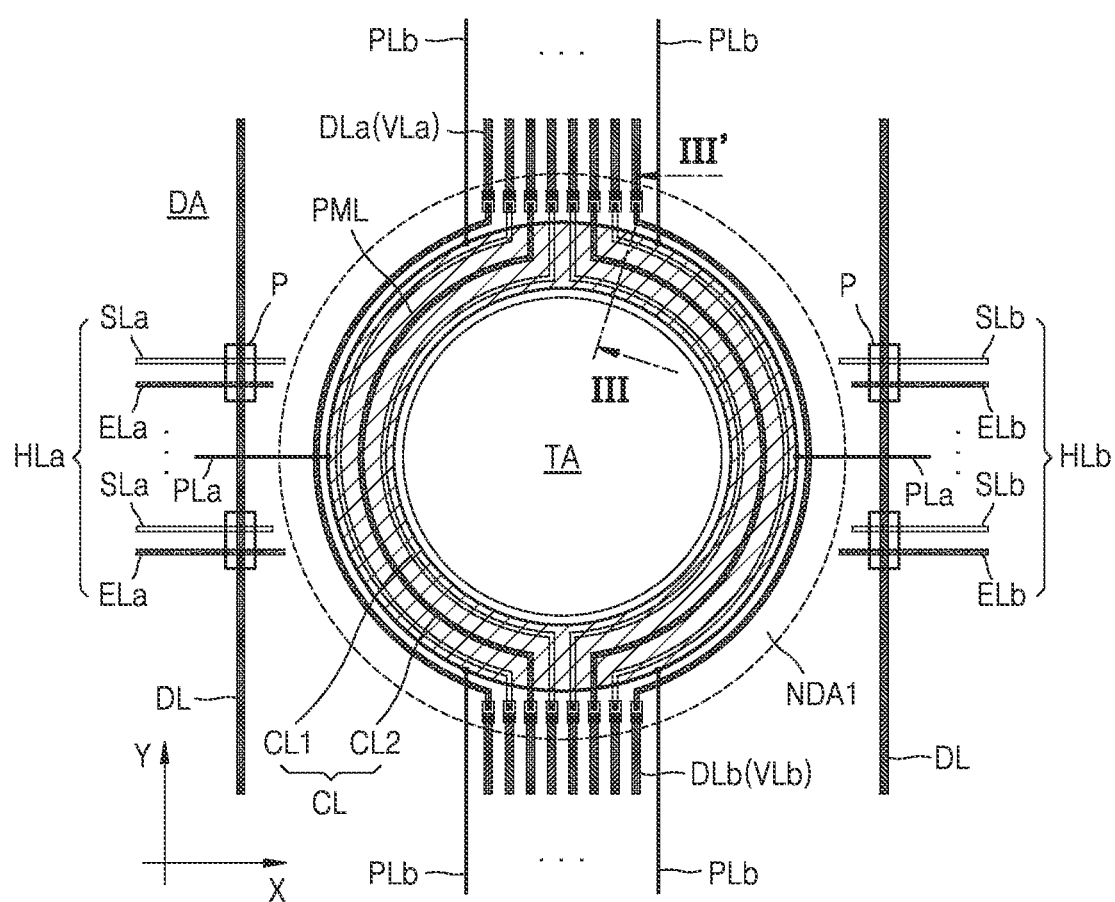
FIG. 10 is a plan view of a portion of a display device according to some example embodiments.
Figure 11:
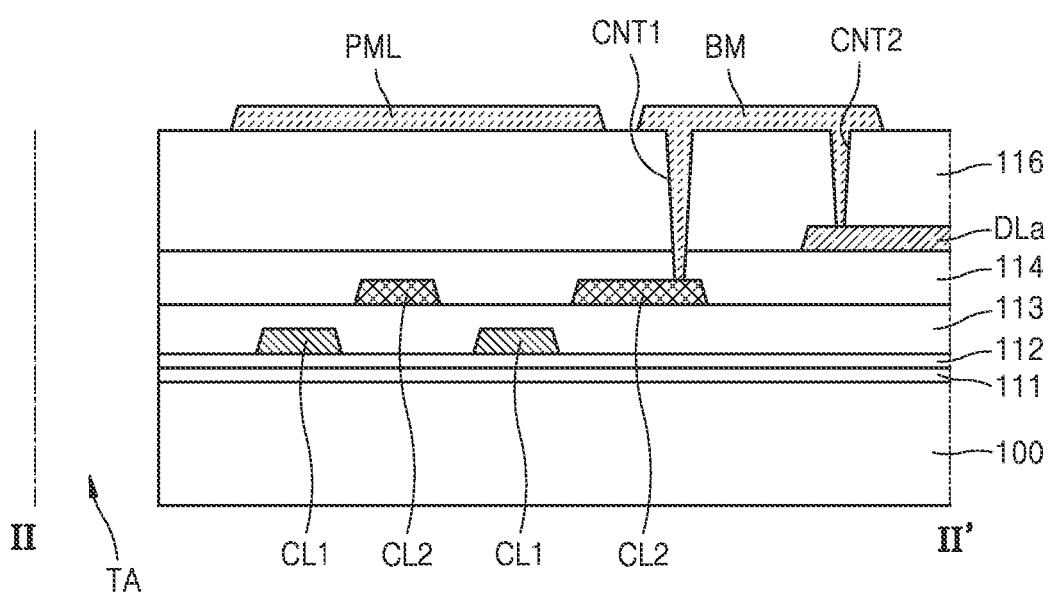
FIG. 11 is a cross-sectional view taken along the line III-III' of FIG. 10.

FIG. 10 is a plan view of a portion of a display device according to some example embodiments, and FIG. 11 is a cross-sectional view that corresponds to the line III-III' of FIG. 10. In FIGS. 10 and 11, because the same reference numerals as those of FIGS. 7 and 6A represent the same members, some repeated description thereof may be omitted.

Referring to FIGS. 10 and 11, the display device may further include an electrode layer PML surrounding the transmission area TA. The electrode layer PML may be connected to a horizontal driving voltage line PLa extending in the first direction. Also, the electrode layer PML may be connected to a vertical driving voltage line PLb extending in the second direction.

The horizontal driving voltage line PLa and/or the vertical driving voltage line PLb may transfer the driving voltage ELVDD to the plurality of pixels P. The horizontal driving voltage line PLa may extend from the second electrode CE2 of the storage capacitor Cst. The vertical driving voltage line PLb may extend from the first power supply line 160 (see FIG. 4) outside the display area DA. The horizontal driving voltage line PLa and the vertical driving voltage line PLb may be arranged on different layers and connected to each other through a contact hole. A plurality of horizontal driving voltage lines PLa and a plurality of vertical driving voltage lines PLb may constitute a mesh structure.

The electrode layer PML may at least partially overlap the plurality of connection lines CL. Therefore, an area of the first non-display area NDA1 may be reduced. According to some example embodiments, as shown in the drawing, the electrode layer PML may be arranged on the first planarization layer 116. According to some example embodiments, the electrode layer PML may be arranged on the interlayer insulating layer 114.

The electrode layer PML may be provided in a shape surrounding the transmission area TA. Because the driving voltage lines, that is, the horizontal driving voltage lines PLa and the vertical driving voltage lines PLb on the left and right of, and above and below the transmission area TA may be connected to each other by the electrode layer PM, the driving voltage ELVDD may be uniformly provided around the transmission area TA.

Figure 12:
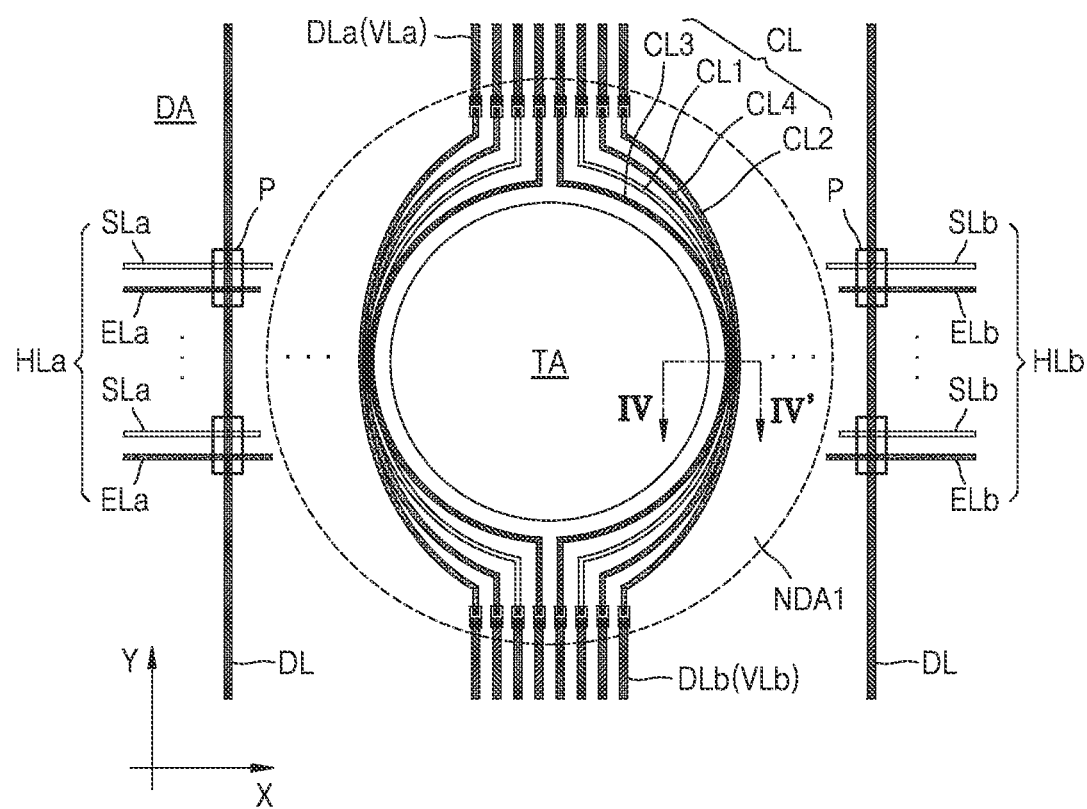
FIG. 12 is a plan view of a portion of a display device according to some example embodiments.
Figure 13:
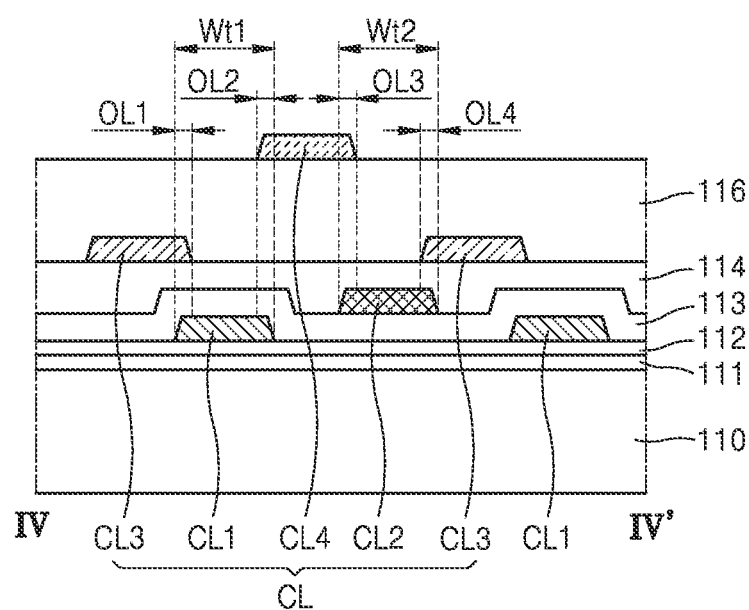
FIG. 13 is a cross-sectional view taken along the line IV-IV' of FIG. 12.

FIG. 12 is a plan view of a portion of a display device according to some example embodiments. For example, the surroundings of the transmission area TA are shown. FIG. 13 is a cross-sectional view taken along the line IV-IV' of FIG. 12. In FIG. 12, because the same reference numerals as those of FIG. 7 represent the same members, some repeated description thereof may be omitted.

Referring to FIG. 12, the plurality of connection lines CL may include the first connection line CL1, the second connection line CL2, a third connection line CL3, and a fourth connection line CL4 each arranged on different layers.

In this case, the first connection line CL1 may be arranged on the same layer as a layer on which at least one of the plurality of first horizontal lines HLa is arranged. For example, the first connection line CL1 may be arranged on the same layer as a layer on which the first wiring line WL1 described with reference to FIGS. 6A to 6C is arranged. That is, the first connection line CL1 may be arranged on the same layer as a layer on which the first gate electrode G1 of the first thin film transistor TFT1 is arranged.

The second connection line CL2 may be arranged on a layer different from the layer on which the first connection line CL1 is arranged, and may be arranged on the same layer as a layer on which at least one of the plurality of first horizontal lines HLa is arranged. For example, the second connection line CL2 may be arranged on the same layer as a layer on which the second wiring line WL2 described with reference to FIGS. 6A to 6C is arranged. That is, the second connection line CL2 may be arranged on the same layer as a layer on which the second electrode CE2 of the storage capacitor Cst is arranged.

The third connection line CL3 may be arranged on the same layer as a layer on which at least one of the plurality of first vertical lines VLa is arranged. For example, the third connection line CL3 may be arranged on the same layer as a layer on which the third wiring line WL3 described with reference to FIGS. 6A to 6C is arranged. That is, the third connection line CL3 may be arranged on the same layer as a layer on which the data line DL is arranged.

The fourth connection line CL4 may be arranged on a layer different from the layers on which the first to third connection lines CL1, CL2, and CL3 are arranged. For example, the fourth connection line CL4 may be arranged on the same layer as a layer on which the fourth wiring line WL4 described with reference to FIGS. 6B and 6C is arranged.

Locations of the first to fourth connection lines CL1, CL2, CL3, and CL4 may be variously changed. For example, the locations of the first to fourth connection lines CL1, CL2, CL3, and CL4 may be properly selected from the first to sixth wiring lines WL1, WL2, WL3, WL4, WL5, and WL6 described with reference to FIG. 6C.

The first to fourth connection lines CL1, CL2, CL3, and CL4 may be arranged in a direction from the transmission area TA to the display area DA, the first connection line CL1, the fourth connection line CL4, the second connection line CL2, and the third connection line CL3 being sequentially repeatedly arranged.

The connection lines CL may be arranged in the first non-display area NDA1 surrounding the transmission area TA. The connection line CL may extend in the second direction (the Y-direction) so as to connect the first data line DLa to the second data line DLb and may detour along the edge of the transmission area TA in the first non-display area NDA1.

For example, in the case where the transmission area TA is provided in a circular shape, the connection lines CL may be curved with a curvature along the edge of the transmission area TA. In this case, a connection line CL close to the transmission area TA may be curved with a large curvature along the edge of the transmission area TA, and a curvature of a connection line CL away from the transmission area TA may be reduced. Though it is shown in the drawing that the connection lines CL are curves of arcs, a detouring portion may be provided in a line bent in zigzags.

The plurality of connection lines CL may include regions overlapping each other.

Referring to FIG. 13, the third connection line CL3 may be arranged between the first connection line CL1 and the second connection line CL2. In this case, the third connection line CL3 may include regions respectively overlapping a portion of the first connection line CL1 and a portion of the second connection line CL2.

The fourth connection line CL4 may be arranged between the first connection line CL1 and the second connection line CL2. In this case, the fourth connection line CL4 may include regions respectively overlapping a portion of the first connection line CL1 and a portion of the second connection line CL2.

For example, the first connection line CL1 may have a first overlapping length OL1 with respect to the third connection line CL3. The first overlapping length OL1 may have a length of about 15% to about 35% of a width Wt1 of the first connection line CL1. According to some example embodiments, the width Wt1 of the first connection line CL1 may be about 1.5 μm to about 3 μm, and the first overlapping length OL1 may be about 0.5 μm to about 1 μm.

The first connection line CL1 may have a second overlapping length OL2 with respect to the fourth connection line CL4. The second overlapping length OL2 may have a length of about 15% to about 35% of the width Wt1 of the first connection line CL1. According to some example embodiments, the width Wt1 of the first connection line CL1 may be about 1.5 μm to about 3 μm, and the second overlapping length OL2 may be about 0.5 μm to about 1 μm.

The second connection line CL2 may have a third overlapping length OL3 with respect to the fourth connection line CL4. The third overlapping length OL3 may have a length of about 15% to about 35% of a width Wt2 of the second connection line CL2. According to some example embodiments, the width Wt2 of the second connection line CL2 may be about 1.5 μm to about 3 μm, and the third overlapping length OL3 may be about 0.5 μm to about 1 μm.

The second connection line CL2 may have a fourth overlapping length OL4 with respect to the third connection line CL3. The fourth overlapping length OL4 may have a length of about 15% to about 35% of the width Wt2 of the second connection line CL2. According to some example embodiments, the width Wt2 of the second connection line CL2 may be about 1.5 μm to about 3 μm, and the fourth overlapping length OL4 may be about 0.5 μm to about 1 μm.

According to some example embodiments, a separation distance between the first connection line CL1 and the second connection line CL2 along a top surface of the substrate 100 may be about 0.5 μm to about 1 μm.

According to some example embodiments, a separation distance between the third connection line CL3 and the fourth connection line CL4 along the top surface of the substrate 100 may be about 0.5 µm to about 1 µm.

Because the plurality of connection lines CL include regions overlapping each other, the area of the first non-display area NDA1 may be reduced.

Figure 14:
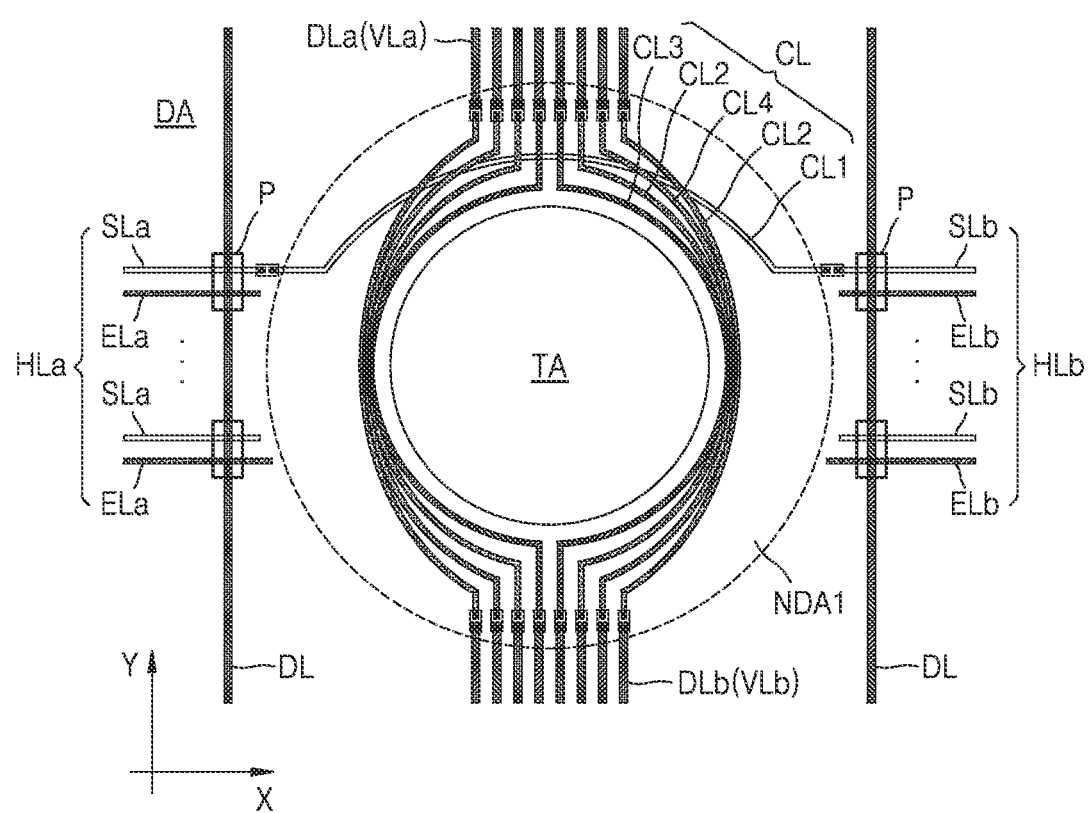
FIG. 14 is a plan view of a portion of a display device according to some example embodiments.
Figure 15:
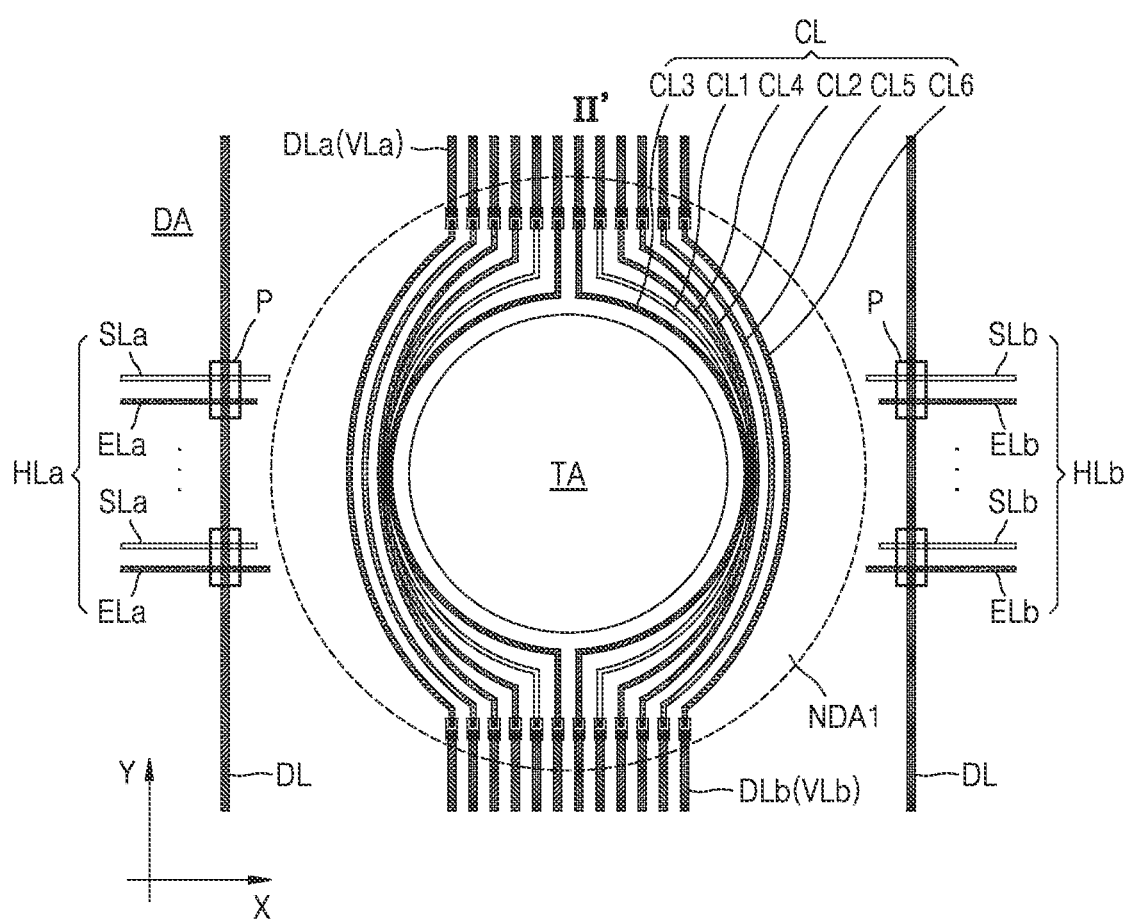
FIG. 15 is a plan view of a portion of a display device according to some example embodiments.

FIGS. 14 and 15 are plan views of a portion of a display device according to embodiments. For example, the surroundings of the transmission area TA are shown.

In FIGS. 14 and 15, because the same reference numerals as those of FIG. 12 represent the same members, some repeated description thereof may be omitted.

Referring to FIG. 14, at least one of the first horizontal lines HLa may be connected to at least one of the second horizontal lines HLb by the horizontal connection line HCL. The horizontal connection line HCL may be arranged on the same layer as a layer on which the first wiring line WL1 is arranged. In this case, the plurality of connection lines CL may include connection lines arranged on a layer different from the layer on which the horizontal connection line HCL is arranged. For example, the plurality of connection lines CL may include the second connection line CL2, the third connection line CL3, and the fourth connection line CL4.

Also, the plurality of connection lines may further include a third horizontal line (not shown) extending from the display area DA and detouring around the transmission area TA.

Referring to FIG. 15, the plurality of connection lines CL may include the first connection line CL1, the second connection line CL2, the third connection line CL3, the fourth connection line CL4, the fifth connection line CL5, and the sixth connection line CL6.

The fifth connection line CL5 and the sixth connection line CL6 may be arranged on layers different from layers on which the first to fourth connection lines CL1, CL2, CL3, and CL4 are arranged. For example, the fifth connection line CL5 may be arranged on the same layer as a layer on which the fifth wiring line WL5 described with reference to FIG. 6C is arranged. The sixth connection line CL6 may be arranged on the same layer as a layer on which the sixth wiring line WL6 described with reference to FIG. 6C is arranged.

As described above, because the plurality of connection lines CL are arranged on various layers, the area of the first non-display area NDA1 may be reduced.

At least one of the first horizontal lines HLa may be connected to at least one of the second horizontal lines HLb. Also, the plurality of connection lines may further include a third horizontal line extending from the display area DA and detouring around the transmission area TA.

A display device according to embodiments may have a reduced non-display area around the transmission area. Also, because wirings around the transmission area are connected through a connection line, the display device may prevent damage by electrostatic discharge. This effect is provided as an example and the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display device comprising:
a substrate including a transmission area and a display area surrounding the transmission area; a plurality of display elements in the display area;
a plurality of first lines and a plurality of second lines spaced apart from each other with the transmission area therebetween;
a first connection line connecting at least one of the plurality of first lines to at least one of the plurality of second lines and detouring around the transmission area; and
a bridge metal connecting the first connection line to the at least one of the plurality of first lines,
wherein the bridge metal is connected to the first connection line through a first contact hole, and the bridge metal is connected to the at least one of the plurality of first lines through a second contact hole.

2. The display device of claim 1, further comprising:
a second connection line connecting at least one of the plurality of first lines to at least one of the plurality of second lines and detouring around the transmission area,
wherein the second connection line is on a second layer different from a first layer.

3. The display device of claim 2, wherein
the first connection line and the second connection line are respectively provided as a plurality of first connection lines and a plurality of second connection lines, and
the plurality of first connection lines and the plurality of second connection lines are alternately arranged around the transmission area.

4. The display device of claim 3, further comprising:
a thin film transistor in the display area, the thin film transistor including a first semiconductor layer and a first gate electrode, and the first connection line is on a same layer as the first gate electrode.

5. The display device of claim 4, further comprising:
a storage capacitor in the display area, the storage capacitor including a first electrode and a second electrode, the first electrode being on a same layer as the first gate electrode, and the second electrode being over the first electrode,
wherein the second connection line is on a same layer as the second electrode.

6. The display device of claim 1, further comprising:
a third line extending from the display area and detouring around the transmission area,
wherein the third line is in a layer different from a first layer, and
wherein the third line intersects the first connection line in a plan view.

7. The display device of claim 1, further comprising:
an electrode layer surrounding the transmission area and overlapping the first connection line;
a first driving voltage line extending in a first direction; and
a second driving voltage line extending in a second direction intersecting with the first direction,
wherein the first driving voltage line and the second driving voltage line are connected to the electrode layer.

8. The display device of claim 1, further comprising:
a third connection line connecting the at least one of the plurality of first lines to the at least one of the plurality of second lines and detouring around the transmission area,
wherein the third connection line is on a third layer that is a same layer as a layer on which the at least one of the plurality of first lines is arranged.

9. The display device of claim 8, further comprising:
a fourth connection line connecting the at least one of the plurality of first lines to the at least one of the plurality of second lines and detouring around the transmission area,
wherein the fourth connection line is on a fourth layer different from the third layer.

10. The display device of claim 9, wherein the fourth connection line is disposed further away from an upper surface of the substrate than the third connection line.

11. A display device comprising:
a substrate including a transmission area, a display area surrounding the transmission area, and a non-display area between the transmission area and the display area;
a plurality of display elements in the display area;
a plurality of first lines and a plurality of second lines spaced apart from each other with the transmission area therebetween; and
a plurality of connection lines in the non-display area, connecting at least one of the plurality of first lines to at least one of the plurality of second lines, and including a first connection line, a second connection line, a third connection line, and a fourth connection line each arranged on different layers,
wherein at least one of the first connection line, the second connection line, third connection line, or fourth connection line overlaps at least part of another one in a plan view.

12. The display device of claim 11, further comprising:
a thin film transistor in the display area, the thin film transistor including a first semiconductor layer and a first gate electrode, and the first connection line is on a same layer as the first gate electrode.

13. The display device of claim 12, further comprising:
a storage capacitor in the display area, the storage capacitor including a first electrode and a second electrode, the first electrode being on a same layer as the first gate electrode, and the second electrode being over the first electrode,
wherein the second connection line is on a same layer as the second electrode.

14. The display device of claim 11, wherein the third connection line is on a third layer that is a same layer as at least one of a plurality of first vertical lines.

15. The display device of claim 11, wherein
the third connection line has regions respectively overlapping a portion of the first connection line and a portion of the second connection line between the first connection line and the second connection line in a plan view.

16. The display device of claim 11, wherein the fourth connection line is disposed further away from an upper surface of the substrate than the third connection line.

17. The display device of claim 16, wherein
the fourth connection line has regions respectively overlapping a portion of the first connection line and a portion of the second connection line between the first connection line and the second connection line in a plan view.

18. The display device of claim 11, further comprising:
a third line extending from the display area and detouring around the transmission area,
wherein the third line is in a layer different from a first layer, and
wherein the third line intersects the first connection line in a plan view.

19. The display device of claim 11, further comprising:
a bridge metal connecting the first connection line to the at least one of the plurality of first lines,
wherein the bridge metal is connected to the first connection line through a first contact hole, and the bridge metal is connected to the at least one of the plurality of first lines through a second contact hole.

20. The display device of claim 11, wherein
the plurality of connection lines further include a fifth connection line on a layer different from layers on which the first connection line, the second connection line, the third connection line, and the fourth connection line are arranged.

* * * * *